US006829091B2

(12) United States Patent
Kato et al.

(10) Patent No.: US 6,829,091 B2
(45) Date of Patent: Dec. 7, 2004

(54) OPTICAL SYSTEM AND OPTICAL INSTRUMENT WITH DIFFRACTIVE OPTICAL ELEMENT

(75) Inventors: Takashi Kato, Utsunomiya (JP); Kenji Saitoh, Utsunomiya (JP); Hiroshi Maehara, Yokohama (JP); Makoto Ogusu, Utsunomiya (JP); Keiko Chiba, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/362,698

(22) Filed: Jul. 29, 1999

(65) Prior Publication Data

US 2003/0016447 A1 Jan. 23, 2003

Related U.S. Application Data

(63) Continuation-in-part of application No. 09/019,697, filed on Feb. 6, 1998.

(30) Foreign Application Priority Data

| Feb. 7, 1997 | (JP) | 09-040012 |
| Apr. 30, 1997 | (JP) | 09-126336 |
| Jul. 31, 1998 | (JP) | 10-230275 |
| Aug. 6, 1998 | (JP) | 10-234928 |
| Aug. 6, 1998 | (JP) | 10-234929 |

(51) Int. Cl.$^7$ ............................................. G02B 5/18
(52) U.S. Cl. .......................................... 359/569; 359/16
(58) Field of Search ................................. 359/558, 566, 359/565, 569, 724, 16, 358; 355/18

(56) References Cited

U.S. PATENT DOCUMENTS

| 4,983,017 A | * | 1/1991 | Tsuji et al. .................. 359/566 |
| 5,013,133 A | * | 5/1991 | Buralli et al. ................ 359/558 |
| 5,218,471 A | * | 6/1993 | Swanson et al. ............. 359/565 |
| 5,260,828 A | * | 11/1993 | Londono et al. ............. 359/565 |
| 5,353,166 A | | 10/1994 | Hanford et al. ............. 359/819 |
| 5,424,552 A | * | 6/1995 | Tsuji et al. .................. 250/548 |
| 5,488,514 A | | 1/1996 | Bruning et al. ............. 359/811 |
| 5,754,340 A | * | 5/1998 | Ushida et al. ............... 359/566 |
| 6,157,452 A | * | 12/2000 | Hasegawa et al. ........... 356/401 |

FOREIGN PATENT DOCUMENTS

JP          6-242373          2/1994

* cited by examiner

Primary Examiner—Mark A. Robinson
Assistant Examiner—Alessandro Amari
(74) Attorney, Agent, or Firm—Fitzpatrick, Cella, Harper & Scinto

(57) ABSTRACT

An optical system for forming an image of an object. The optical system includes an optical element, which is deformed by the weight thereof, and at least one optical member for preventing a change in optical performance of the optical system due to deformation of the optical element, when the optical element is provided in the optical system.

11 Claims, 29 Drawing Sheets

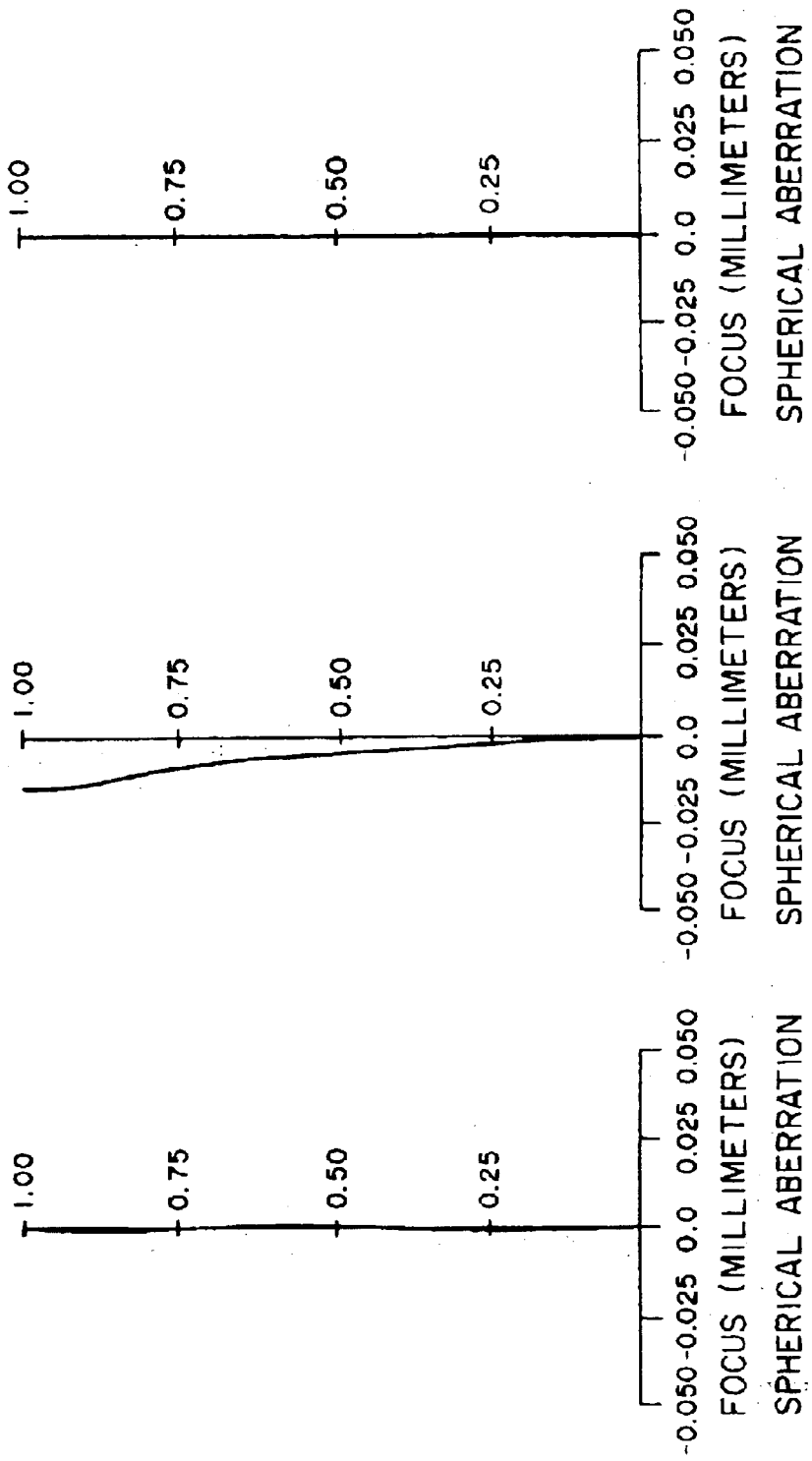

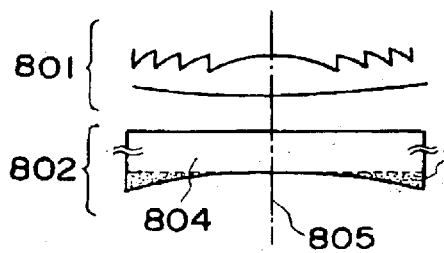
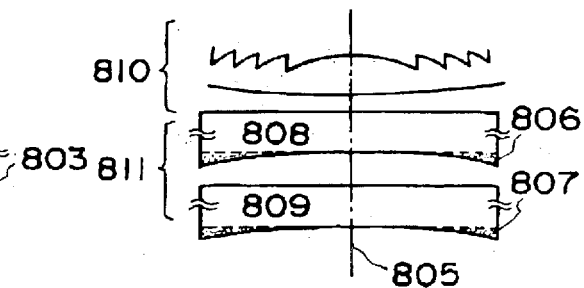
FIG. 8A     FIG. 8B
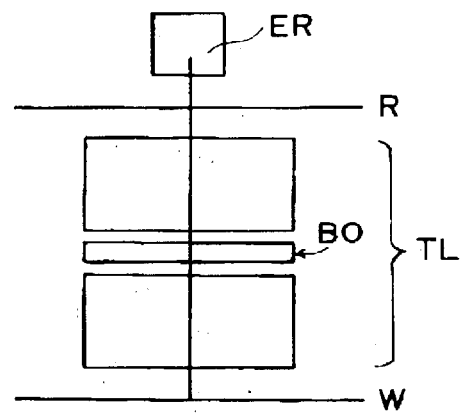
FIG. 9

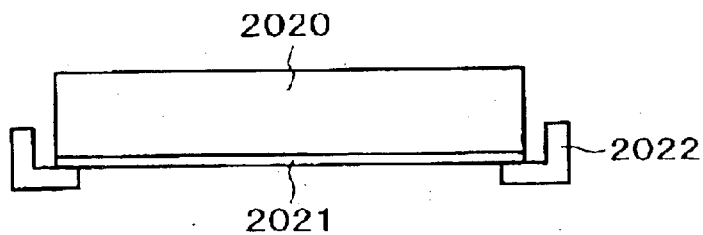
FIG. 26
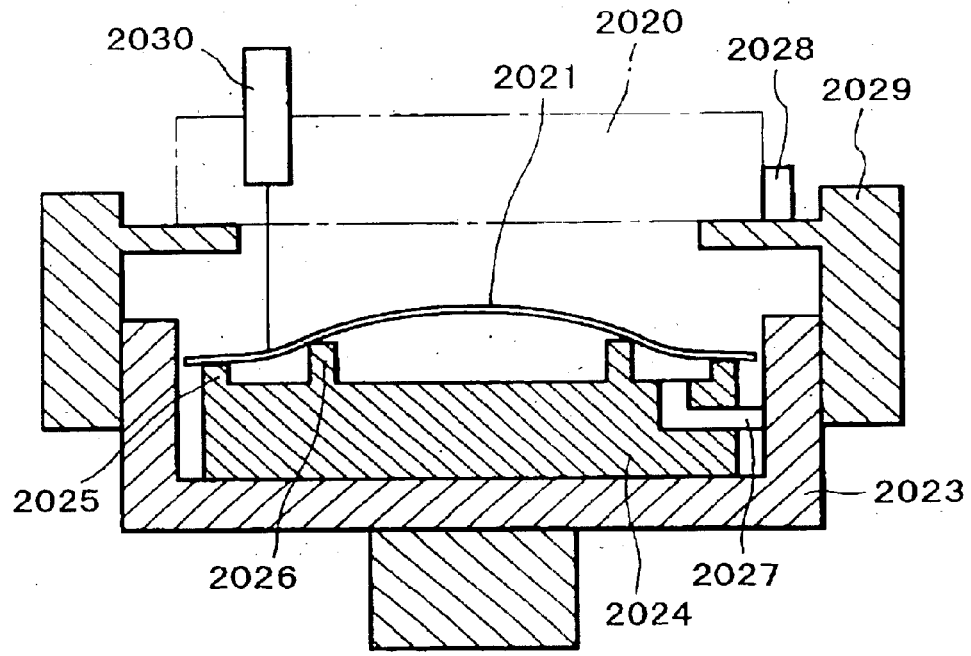
FIG. 27   FIG. 28
FIG. 29

HYDROGEN BOND
QUARTZ-WATER    WATER-WATER    FLUORITE-WATER
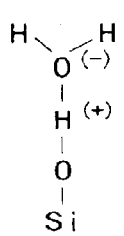 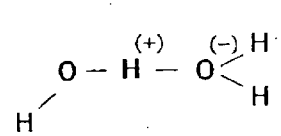 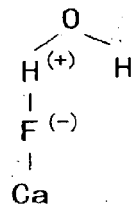
FIG. 30A
VAN DER WAAL'S FORCE

FIG. 31
FIG. 32
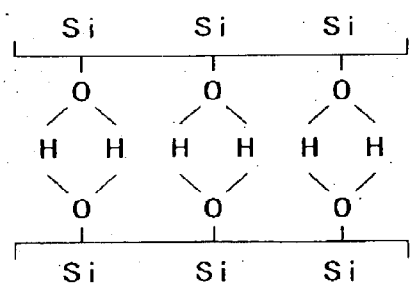
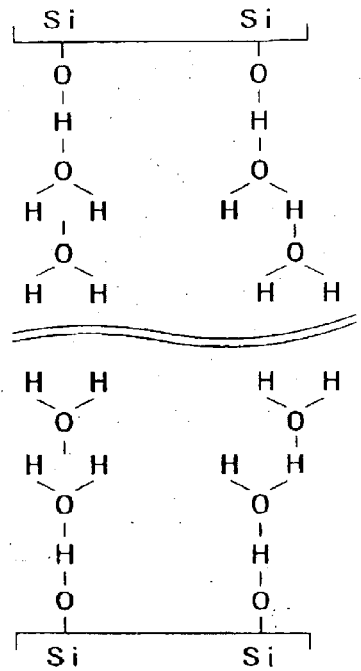
FIG. 33

OPTICAL SYSTEM AND OPTICAL INSTRUMENT WITH DIFFRACTIVE OPTICAL ELEMENT

FIELD OF THE INVENTION AND RELATED ART

This is a continuation-in-part application of U.S. patent application, Ser. No 09/019,697 filed Feb. 6, 1998.

This invention relates to an optical system, optical unit or optical instrument with a diffractive optical element.

Many proposals have recently been made with respect to an optical system with a diffractive optical element, such as, for example, a Fresnel zone plate, a diffraction grating or a hologram.

A diffractive optical element may be used as an optical element for transforming a received wave front into a predetermined wave front. Such a diffractive optical element has unique characteristics not provided by a refraction type lens. For example, it has a dispersion value inverse to that of a refraction type lens, and also it has no substantial thickness. Thus, an optical system can be made compact.

For manufacture of a binary type diffractive optical element which is one of phase type diffraction gratings, a semiconductor device manufacturing technique is applicable to it, and a grating of fine pitch can be produced relatively easily. For this reason, many studies have been made directed to a binary type diffractive optical element with blazed shape being approximated by a step-like structure.

FIG. 1 shows a binary type diffractive optical element. This binary type diffractive optical element has a diffractive optical surface 204, having been formed by removing, from the shape of a flat-convex type refraction lens 201 (FIG. 1, (A)), portions that provide an optical path difference corresponding to n times the wavelength (n is an integer), and by quantizing the shape of a resultant diffractive optical element 202 (with a shape shown in FIG. 1, (B)) with a thickness corresponding to a fraction of the wavelength so that the shape is approximated with a step-like structure such as shown in FIG. 1, (C).

In FIG. 1, denoted at 203 and 205 each is a transparent substrate on which a diffractive optical surface 202 or 204 with a fine shape is formed.

FIG. 2 illustrates manufacturing processes for a known binary type diffractive optical element having a four-step (level) structure. Denoted in the drawing at 300 is a transparent glass substrate (refractivity: n), and denoted at 301 is a resist. Denoted at 302 is a mask to be used for a first exposure, and denoted at 303 or 306 is exposure light. Here, the resist 301 comprises a positive type resist.

First, in process A, the pattern of the mask 302 is transferred onto the resist 301 by means of exposure light 303. In process B, development of the resist 301 is performed and, in process C, etching of the glass substrate 300 is executed. Then, in process D, unnecessary resist material on the glass substrate 300 is removed, whereby a binary type diffractive optical element with a two-step (level) structure is completed.

Here, the depth d1 of etching is determined by:

$$d1 = \frac{\lambda}{2(n-1)}$$

where $\lambda$ is the wavelength used with the binary type diffractive optical element.

Subsequently, a resist 304 is again applied to the glass substrate 300 having a binary type diffractive optical element with a two-level structure formed thereon, and in process E a second exposure is performed by use of a mask 305. The pattern of the mask 305 has a pitch a half of that of the pattern of the mask 302. The exposure is performed while accurately registering the edge of a light blocking portion of the mask 305 with the edge of the two-level binary structure. Then, after a developing process in process F, a resist pattern such as illustrated is provided.

Subsequently, in process G, a second etching process is performed and, in process H, unnecessary resist material is removed, whereby a binary type diffractive optical element with a four-step (level) structure is accomplished. Here, the depth d2 of etching defined by the second etching process is determined by:

$$d2 = \frac{\lambda}{4(n-1)}$$

These processes are concerned with a four-level structure and, as is well known, by repeating these processes, a binary type diffractive optical element of an eight-level or a sixteen-level structure can be produced.

In the above-described method the number of steps (levels) that can be formed is limited to $2^n$ (n is a natural number), but by selecting the number of masks used and the pattern line width suitably, a binary type diffractive optical element with a desired number of levels can be produced.

The approximation of a step-like shape may lead to a small decrease of diffraction efficiency. Practically, however, a diffraction efficiency of about 95% (with eight-step approximation) or about 99% (with sixteen-step approximation) will be attainable, and there will be no practical problem.

Many advantages will be provided, as described, with use of a diffractive optical element in a portion of an optical system. However, as regards a diffractive optical element, particularly, a binary type diffractive optical element, in many cases a parallel flat plate is used as a substrate of the diffractive optical element. This is mainly because of ease of manufacture. Generally, the thickness of such substrate is small. Also, when a diffractive optical element is used in an optical system, particularly, in a projection optical system of a semiconductor device manufacturing apparatus such as a stepper, the effective diameter of the diffractive optical element may become very large to meet an increase of numerical aperture (NA). For a diffractive optical element of a large effective diameter and with a small thickness substrate, there is a possibility of deformation of the diffractive optical element due to its weight or deformation of the same when it is mounted in a barrel. It may cause degradation of imaging performance.

SUMMARY OF THE INVENTION

It is an object of the present invention to provide an optical system or an optical unit by which degradation of optical performance is reduced even when a diffractive optical element of large effective diameter and small thickness is used.

In accordance with an aspect of the present invention, there is provided an optical system, comprising: a diffractive optical element having a diffractive optical surface; and means for preventing a change in optical performance of said optical system due to deformation of said diffractive optical element produced when said diffractive optical element is provided in said optical system.

In accordance with another aspect of the present invention, there is provided an optical unit, comprising: a diffractive optical element having a diffractive optical surface; and a reinforcing member connected to said diffractive optical element substantially without damaging the function of said diffractive optical surface.

In accordance with a further aspect of the present invention, there is provided an optical instrument, comprising: an optical system, said optical system including (i) a diffractive optical element having a diffractive optical surface, and (ii) means for preventing a change in optical performance of said optical system due to deformation of said diffractive optical element produced when said diffractive optical element is provided in said optical system; and means for holding said optical system in said optical instrument.

In accordance with a still further aspect of the present invention, there is provided an optical instrument, comprising: an optical unit, said optical unit including (i) a diffractive optical element having a diffractive optical surface, and (ii) a reinforcing member connected to said diffractive optical element substantially without damaging the function of said diffractive optical surface; and means for holding said optical unit in said optical instrument.

In accordance with a yet further aspect of the present invention, there is provided a projection exposure apparatus, comprising: an illumination optical system for illuminating a pattern formed on a mask; and a projection optical system for projecting the pattern of the mask onto a wafer, said projection optical system including (i) a diffractive optical element having a diffractive optical surface, and (ii) means for preventing a change in optical performance of said projection optical system due to deformation of said diffractive optical element produced when said diffractive optical element is provided in said projection optical system In accordance with a yet further aspect of the present invention, there is provided a projection exposure apparatus, comprising: an illumination optical system for illuminating a pattern formed on a mask; and a projection optical system for projecting the pattern of the mask onto a wafer, said projection optical system including (i) a diffractive optical element having a diffractive optical surface, and (ii) a reinforcing member connected to said diffractive optical element substantially without damaging the function of said diffractive optical surface.

In accordance with another aspect of the present invention, there is provided a device manufacturing method including a process for transferring, through projection exposure, a pattern of a mask onto a wafer by use of a projection exposure apparatus as recited above.

In accordance with a further aspect of the present invention, there is provided a device manufacturing method, comprising the steps of: transferring, through projection exposure, a pattern of a mask onto a wafer by use of a projection exposure apparatus as recited above; and developing the wafer having been exposed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 7A–7C show aberrations corresponding to numerical examples.

FIGS. 8A and 8B are schematic views, respectively, of a main portion of a diffractive optical element according to a second embodiment of the present invention.

FIG. 9 is a schematic view of a main portion of an exposure apparatus having an optical unit according to the first or second embodiment of the present invention.

FIG. 26 is a schematic view of a diffractive optical element according to a further embodiment of the present invention.

FIGS. 27 and 28 are enlarged and sectional views, respectively, for explaining examples of bonding at the bonding area.

FIG. 29 is a sectional view of a bonding device.

FIGS. 30A and 30B are schematic views, respectively, for explaining a reaction process.

FIG. 31 is a schematic view for explaining a microstructure.

FIGS. 32 and 33 are schematic views, respectively, for explaining a reaction process.

DESCRIPTION OF THE PREFERRED EMBODIMENTS

Figure 3:
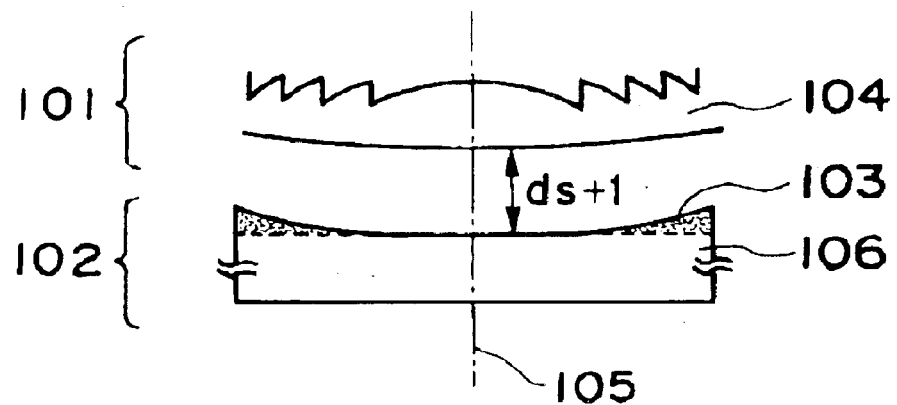
FIG. 3 is a schematic view of a main portion of a diffractive optical element according to a first embodiment of the present invention.

FIG. 3 is a section view of a main portion of a first embodiment of the present invention. Denoted in the drawing at 101 is a diffractive optical element, wherein a diffractive optical surface is formed on a transparent substrate 104. Denoted at 102 is a correction optical element for correcting or compensating for a change in optical characteristic of the diffractive optical element 101 due to deformation by weight of the same. The correction optical element 102 comprises a transparent substrate 106 having a aspherical surface 103 of revolutionally symmetrical shape with respect to an optical axis 105.

An important feature of this embodiment resides in that aberrations produced by deformation of the diffractive optical element 101 (hereinafter also referred to as "diffractive substrate"), such as deformation by gravity or deformation by fixation with a barrel, for example, are corrected by the correction optical element 102 with aspherical surface, disposed adjacent to the diffractive optical element Features of the optical system with diffractive optical element of this embodiment will be described below in detail. First, a simple model is used to determine the amount of deformation of the substrate by its weight. Deformation in a case where a uniform load is applied to a thin circular plate in a direction perpendicular thereto, can be calculated by using a formula which is obtainable theoretically. In this example, the amount of deformation is calculated with respect to a simple case of periphery simple support (no slide restriction).

Figure 4:
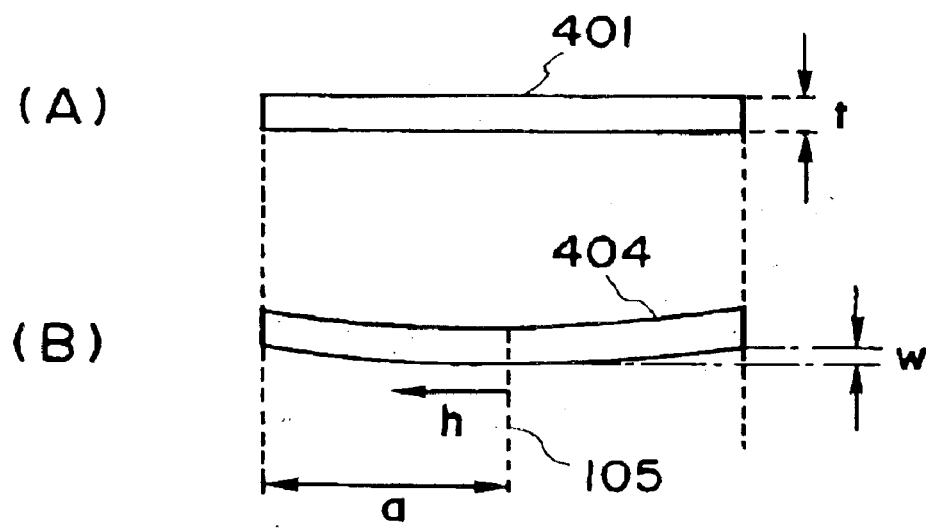
FIG. 4 is a schematic view for explaining deformation of a substrate by weight.

FIG. 4, portion (A), shows a substrate which comprises a thin circular plate 401 (parallel flat plate) without deformation. Here, denoted at a is the distance from the optical axis 105, that is, the radius (mm) of the plate 401. Denoted at t is the thickness thereof. FIG. 4, portion (B), shows the circular plate 404 as being deformed. Denoted at w is the amount of deformation (mm) in the direction of thickness t.

As is known in the art and as seen from the above drawing, the amount of deformation w at a distance h from the optical axis 105 can be calculated in accordance with the following equation:

$$w(h)=[3(1-v^2)p/16Et^3](a^2-h^2)\{[(5+v)/(1+v)]a^2-h^2\} \quad (1)$$

where E is Young's modulus [N/mm$^2$], v is Poisson ratio [dimensionless], p is load per unit area [N/mm$^2$], a is radius of circular plate [mm], t is thickness [mm], and h is radius coordinate [mm].

If discussion is limited to deformation by weight, the load p per unit area is given by the following equation, with density being expressed by ρ [Kg/mm$^3$]:

$$p=9.81\rho t \text{ [N/mm}^2\text{]} \quad (2)$$

Substituting property values of fused silica, for example, into equation (1), such as follows:

$$E=7.31\times10^4 \text{ [N/mm}^2\text{]}$$

$$v=0.170$$

$$\rho=2.22\times10^{-6} \text{ [Kg/mm}^3\text{]} \quad (3)$$

then, from equation (1), the amount of deformation w can be expressed as a quartic function of radius h, as follows:

$$W=\alpha 1+\alpha 2\cdot h^2+\alpha 3\cdot h^4 \text{ [mm]} \quad (4)$$

If the radius a of the plate 401 is a=75 [mm] and the thickness t is t=1 [mm], the coefficients of equation (4) are given as follows:

$$\alpha 1=7.58e-3$$

$$\alpha 2=-1.65e-6$$

$$\alpha 3=5.42e-11 \quad (5)$$

Figure 5:
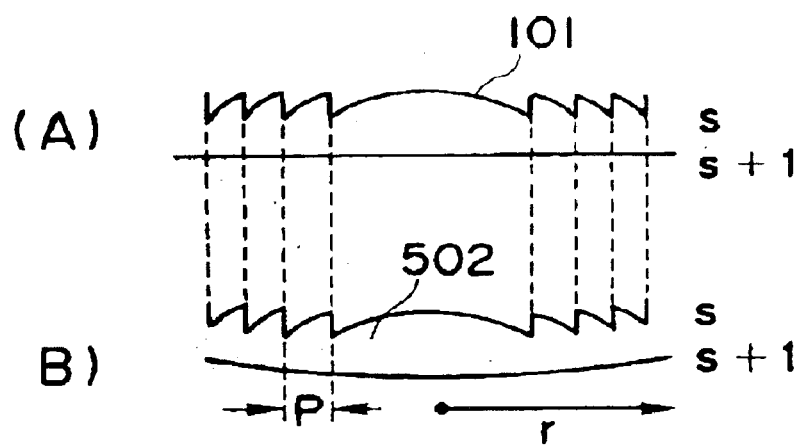
FIG. 5 is a schematic view for explaining deformation of a diffractive optical element by weight.

In this embodiment, the influence of a change in shape of the substrate 401 due to deformation by weight is considered, and a change in phase distribution function of the diffractive optical element is disregarded. This is because the amount of deformation by weight in a direction perpendicular to the direction of gravity force is generally at a low level that can be disregarded, as compared with the amount of deformation in the direction of gravity force. For example, as shown in FIG. 5, portion (B), a diffractive optical element 502 being deformed has approximately the same pitch (e.g., pitch p) as the pitch of phase distribution function of the diffractive optical element 101 (FIG. 5, portion (A)) before deformation by weight. This means that the position in the radius direction r of each ring boundary is unchanged before and after the deformation.

Since deformation, by weight, of optical elements other than the diffractive optical element 101 can be disregarded, the influence of deformation of the diffractive optical element in the optical system appears as a change in surface shape of the substrate 104 and a change in surface interval before and after the substrate 104. Here, the surfaces of the diffractive optical element 101 are denoted by s and s+1, and it is assumed that the diffractive optical element 101 is formed on the surface s (in this embodiment, s=1). Also, the surface interval between the substrate 104 of the diffractive optical element 101 and the correction optical element 102 is here denoted as ds+1 (see FIG. 3).

The substrate shapes of the first and second surfaces of the substrate 104 are expressed as a general formula of an aspherical surface, as follows:

$$x = \{ch^2/1+\sqrt{1-(1+k)c^2h^2}\} + Ah^4 + Bh^6 + \quad (6)$$

where c is the paraxial curvature radius of the surface, x is the coordinate in the optical axis direction (thickness t direction), and k, A, B, . . . are aspherical coefficients.

Here, if k (conical constant)=−1, the surface shape x after deformation by weight can be given as follows:

$$x = (c/2)h^2 + Ah^4 \quad (7)$$

Comparing it with equation (4), it follows that:

$$c/2 = \alpha 2, \text{ and } A = \alpha 3 \quad (8)$$

Also, the amount of change Δds of the surface interval ds+1 can be considered in direct association with the maximum amount of change ($\alpha 1$) due to deformation by weight.

In this manner, the amount of surface deformation W of the diffractive optical element as well as the amount of change Δds of the surface interval ds+1, due to deformation by weight, can be determined. For correction of a change in imaging performance resulting from such surface deformation and a change of surface interval, the correction optical element 102 is disposed in the vicinity of the diffractive optical element. Alternatively, it may be disposed after deformation by weight is produced. By setting the aspherical surface amount suitably, adverse effect of deformation by weight to the imaging performance can be prevented.

Figure 6:
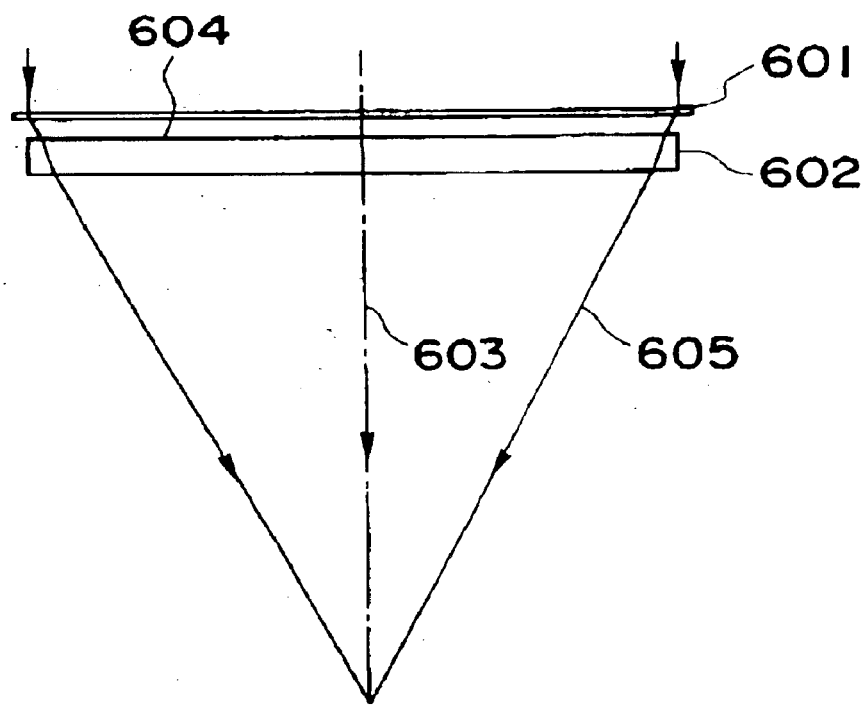
FIG. 6 is a schematic view of an optical system corresponding to numerical examples.

Specific numerical examples according to this embodiment will be described below. FIG. 6 is a schematic view of an example of an optical system according to this embodiment. Denoted in the drawing at 601 is a diffractive optical element, and denoted at 602 is a correction optical element. Denoted at 603 is an optical axis, and denoted at 604 is a surface of the correction optical element 602 where an aspherical surface is to be formed. Denoted at 605 is an on-axis light flux.

Numerical example 1, below, shows numerical data of the optical system in a state where there is no deformation of diffractive optical element 601 by weight. In the numerical example, $r_i$ denotes the curvature radius of the i-th surface, $d_i$ denotes the spacing between the i-th surface and the (i−1)th surface, and n is the refractivity. FIG. 7A illustrates imaging performance corresponding to this example, the imaging performance being illustrated with respect to spherical aberration. In this case, the substrate of the diffractive optical element 601 comprises a parallel flat plate, and deformation by weight is not considered. Also, no aspherical surface is provided, at this stage, on the correction optical element 602. The coefficients of phase distribution function in the numerical example are defined as follows:

$$f(h) = a1 \cdot h^2 + a2 h^4 + a3 \cdot h^6 + a4 \cdot h^8 + \ldots \quad g(h) 2\pi/\lambda \cdot f(h)$$

wherein f(h) is optical path length function;
g(h) is phase distribution function;
a1, a2, a3, a4, . . . are coefficients of phase polynomial; and
λ is wavelength.

NUMERICAL EXAMPLE 1

| Objective Distance = Infinite, λ = 248 nm | | | |
|---|---|---|---|
| i | $r_i$ | $d_i$ | |
| 1 | 0 | 1.0 | n = 1.508456 (silica) |
| 2 | 0 | 5.0 | |
| 3 | 0 | 10.0 | n = 1.508456 (silica) |
| 4 | 0 | | |

| Coefficients Phase Distribution Function of Diffractive Optical Element | | | | |
|---|---|---|---|---|
| i | a1 | a2 | a3 | a4 |
| 1 | −0.00333 | 0.359917e-7 | −0.74132e-12 | 0.140112e-16 |

Next, a case where there is deformation by weight produced in the diffractive optical element 601 and where degradation of imaging performance due to the influence of deformation has not yet been corrected by the aspherical surface provided on the correction optical element 602, will be described. Numerical example 2 below shows numerical data of the optical system in such a case, and FIG. 7B shows corresponding image performance. Thus, in accordance with equations (4) and (8), the diffractive optical element 601 and the surface spacing ds+1 are deformed or changed. Also, there is no aspherical surface provided at this stage on the correction optical element 602. As seen from FIG. 7B, spherical aberration becomes worse, as a result of deformation by weight of the diffractive optical element.

NUMERICAL EXAMPLE 2

| Object Distance = Infinite | | | |
|---|---|---|---|
| i | $r_i$ | $d_i$ | |
| 1 | −302396.4251 | 1.0 | n = 1.508456 (silica) |
| 2 | −302396.4251 | 4.992416 | |
| 3 | 0 | 10.0 | n = 1.508456 (silica) |
| 4 | 0 | | |

| Coefficients Phase Distribution Function of Diffractive Optical Element | | | | |
|---|---|---|---|---|
| i | a1 | a2 | a3 | a4 |
| 1 | −0.00333 | 0.359917e-7 | −0.74132e-12 | 0.140112e-16 |

| Aspherical Coefficients | | |
|---|---|---|
| i | K | A |
| 1 | −1.0 | 0.54246e-10 |
| 2 | −1.0 | 0.54246e-10 |

Numerical Example 3 below shows numerical data of the optical system wherein, to the effect of deformation by weight of the diffractive optical element 601, an aspherical surface is defined on one surface 604 of the correction optical element 602, disposed adjacent to the diffractive optical element, to correct the imaging performance. FIG. 7C shows spherical aberration, in this example. As seen from the drawing, the effect of deformation by weight of the diffractive optical element 601 can be corrected satisfactorily.

NUMERICAL EXAMPLE 3

Object Distance = Infinite

| i | $r_i$ | $d_i$ | |
|---|---|---|---|
| 1 | −302396.4251 | 1.0 | n = 1.508456 (silica) |
| 2 | −302396.4251 | 4.992416 | |
| 3 | 0 | 10.0 | n = 1.508456 (silica) |
| 4 | 0 | | |

Coefficients Phase Distribution Function of Diffractive Optical Element

| i | a1 | a2 | a3 | a4 |
|---|---|---|---|---|
| 1 | −0.00333 | 0.359917e-7 | −0.74132e-12 | 0.140112e-16 |

Aspherical Coefficients

| i | K | A | B | C |
|---|---|---|---|---|
| 1 | −1.0 | 0.54246e-10 | | |
| 2 | −1.0 | 0.54246e-10 | | |
| 3 | −1.0 | 0.157455e-9 | 0.601459e-13 | −0.13130e-16 |
| 3 | D | | | |
| | 0.102233e-20 | | | |

FIGS. 8A and 8B are schematic views of an optical system with a diffractive optical element, according to a second embodiment of the present invention. FIG. 8A corresponds to a case where an aspherical surface is provided on the bottom surface of the correction optical element 102 (FIG. 3), and FIG. 8B corresponds to a case where there are plural correction optical elements.

Denoted in these drawings at 801 and 810 are diffractive optical elements having been deformed by weight. Denoted at 802 and 811 are correction optical elements. Denoted at 805 is an optical axis, and denoted at 803, 806 and 807 are aspherical portions. Denoted at 804, 808 and 809 are substrate portions of the correction optical elements.

Both surfaces of the substrate 804 may be formed into aspherical surfaces. It is to be noted that the aspherical surface may not always be revolutionally symmetrical with respect to the optical axis. Any aspherical surface shape may be used, provided that the shape is effective to compensate for deformation of the diffractive optical element. Also, substantially the same advantageous results will be attainable when the structures of this embodiment described above are incorporated into a portion of an optical arrangement including optical systems in addition to a diffractive optical element and a correction optical element. For example, a correction optical element for compensating for the effect of deformation by weight of a diffractive optical element may be disposed in proximity to a portion of an imaging optical system, having plural optical elements, where the diffractive optical element is provided. Similar effects of correcting degradation of imaging performance are provided in this case, like the embodiment described above.

While the present embodiment has been described with reference to an example where a diffractive optical element has a positive refracting power, the diffractive optical element may have a negative refracting power.

Also, while in the embodiments described, deformation of a diffractive optical element has been described with reference to "deformation by weight", the present invention is similarly applicable also to correcting other deformation of a substrate of the diffractive optical element, such as deformation produced when the diffractive optical element is fixed to a barrel, for example.

FIG. 9 is a schematic view of a main portion of a projection exposure apparatus for manufacture of semiconductor devices, according to a third embodiment of the present invention, into which an optical system having a diffractive optical element is incorporated. In this example, a reticle R is illuminated with exposure light from an illumination system ER, and a circuit pattern of the reticle R is projected by a projection optical system TL onto a wafer W surface. Here, the projection optical system TL includes an optical unit BO having a diffractive optical element and a correction optical element. A known development process is then performed to the exposed wafer, and semiconductor devices are produced.

Next, an optical unit having a diffractive optical element according to another embodiment of the present invention, will be described.

Figure 10:
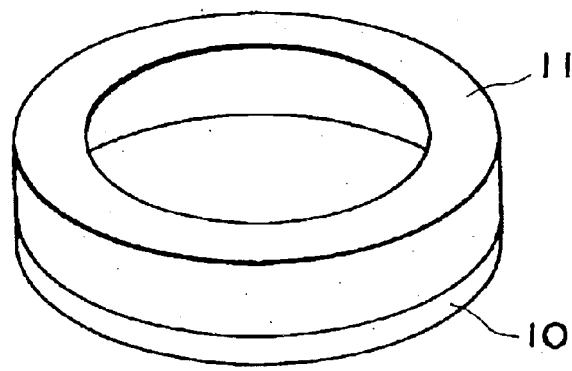
FIG. 10 is a perspective view of an optical unit according to another embodiment of the present invention.
Figure 11:
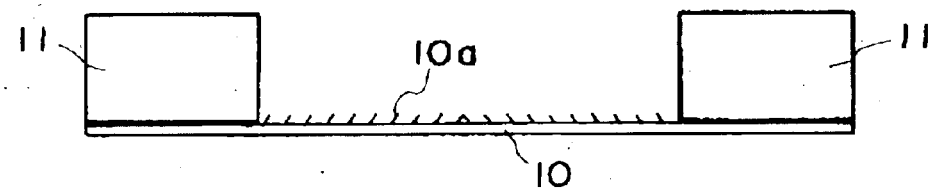
FIG. 11 is a sectional view of the optical unit of the FIG. 10 embodiment.

FIG. 10 is a perspective view of a diffractive optical element with reinforcement, of an optical unit according to this embodiment. A diffractive optical surface 10a of blazed shape (FIG. 11) is provided on one surface of the diffractive optical element 10. There is a reinforcing ring 11 of cylindrical shape, having a height larger than the thickness of the diffractive optical element 10, which is in engagement with the circumferential portion of the diffractive optical element. The ring is adhered through optical contact, whereby adhesive force is assured. FIG. 11 is a sectional view of the diffractive optical element 10 with reinforcement. As shown in FIG. 11, the contact between the diffractive optical element 10 and the reinforcement ring 11 is provided at a circumferential flat portion where no diffractive optical element structure (step structure) is formed. This facilitates uniform application of force for the adhesion. Also, since the adhesion between these elements is performed at the peripheral portion where no effective light is projected, the function of diffractive optical element 10 is not at all damaged.

The strength is improved by unitized structure of the diffractive optical element 10 and the reinforcement ring 11. Since the reinforcing ring 11 has a cylindrical shape, the optical thickness at the central portion of the optical element through which light passes, corresponds just to the thickness of the diffractive optical element 10. Thus, when the structure is used as an optical element for an excimer laser (in such case, a used light source has a narrowed band width, and absorption of light by the material is a critical problems), it provides significant advantages of reduced length of transmissive optical material and enhanced efficiency of utilization of light quantity.

Figure 12:
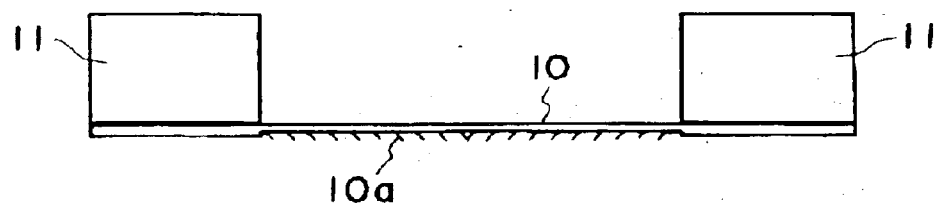
FIG. 12 is a sectional view of an optical unit according to another embodiment of the present invention.

FIG. 12 shows an embodiment wherein a diffractive optical element 10 has a diffractive optical surface 10a, faced downwardly, on the surface opposite to a reinforcing ring 11. The manner of unitization and advantageous results therefrom are essentially the same as in the preceding embodiment.

Figure 13:
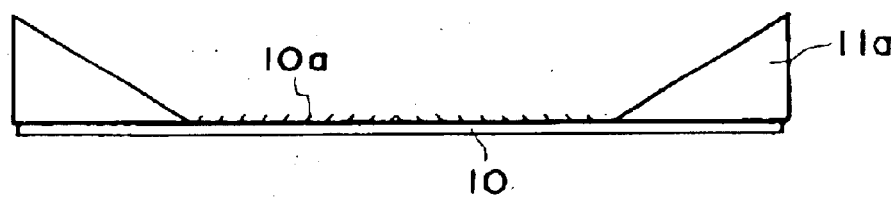
FIG. 13 is a sectional view of an optical unit according to a further embodiment of the present invention.
Figure 14:
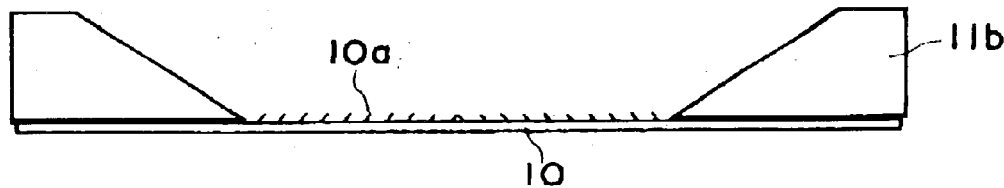
FIG. 14 is a sectional view of an optical unit according to a further embodiment of the present invention.

FIGS. 13 and 14 show embodiments wherein a reinforcing ring 11a, 11b, respectively, has an inside surface, being formed with taper. Also in these examples, from the standpoint of strength, it may preferably be disposed to provide a largest contact area for unitization with the diffractive optical element, while assuring on the other hand disposition not interfering with the light that passes the optical system. Namely, the reinforcing ring 11 may have an inner diameter the same as the effective diameter of the diffractive optical element 10, and also may have a slant face corresponding to the incidence angle of light at the peripheral portion.

The reinforcing ring 11, 11a or 11b, respectively, may not always be made of the same material as the diffractive optical element 10, provided that it has a similar thermal expansion coefficient. Also, a non-transparent material may be used. However, since any light that passes a region other than the effective diameter of the diffractive optical element 10 is unwanted light, preferably the ring may perform light interception.

The adhesion between the diffractive optical element 10 and the reinforcing ring 11, 11a, 11b, respectively, is not limited to use of optical contact. An adhesive material may of course be used.

Figure 1:
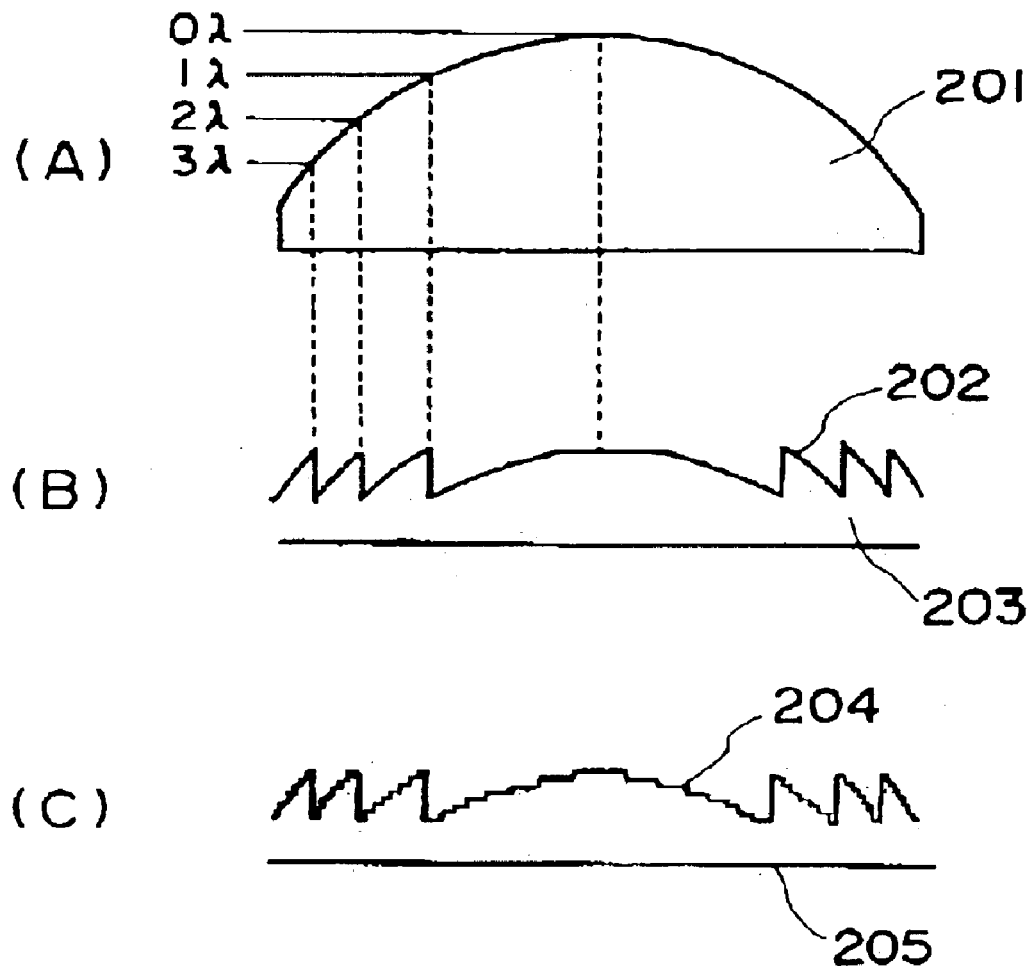
FIG. 1 is a schematic view for explaining a binary type diffractive optical element.
Figure 2:
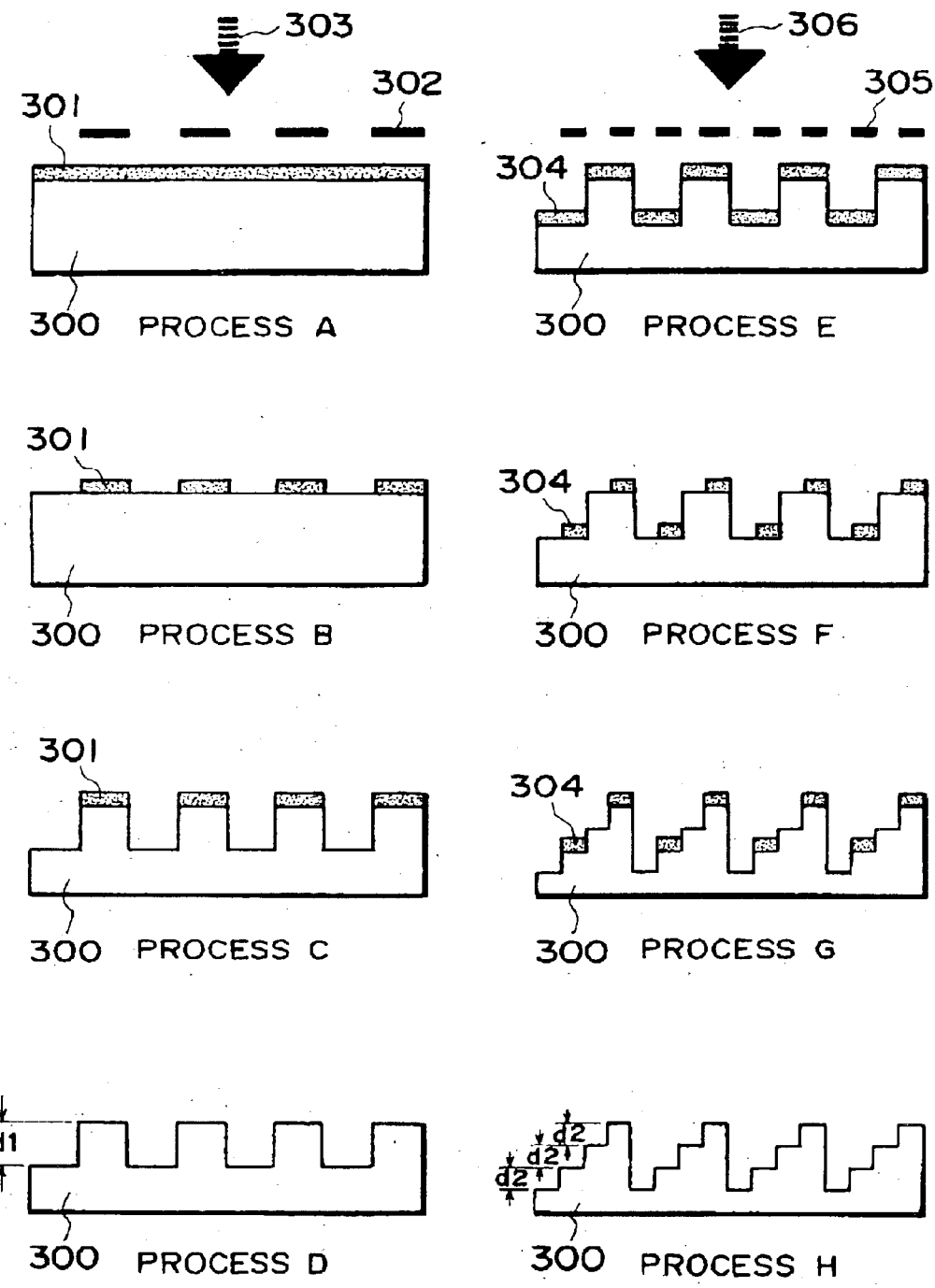
FIG. 2 is a schematic view for explaining processes for manufacturing a binary type diffractive optical element.

Since manufacture of a diffractive optical element 10 of this embodiment requires fine processing (FIG. 2), a similar procedure and similar machines as in the semiconductor device manufacturing processes will be used. For this reason, a diffractive optical element will be provided on a substrate of a thickness 0.625 mm to a few millimeters. A thin diffractive optical element 10 will be formed into a device of outside shape of about 100–200 mm, and then it will be mounted into a projection optical system of a semiconductor exposure apparatus. Thus, when the diffractive optical element is mounted, there is a large possibility of surface deformation produced by the weight of the diffractive optical element or surface deformation produced as a result of fixation. In that occasion, design performance can not be provided, and image performance of the whole projection system is degraded. Thus, reinforcement of the diffractive optical element 10 as described above is very effective to prevent deformation by weight or by fixation.

In this embodiment, a separate ring-like member is connected into an integral structure with the diffractive optical element, to reinforce the latter, whereby sufficient strength for preventing deformation is assured. This avoids deformation due to fixation, and desired imaging performance is provided. Also, since in this embodiment the thickness of glass material does not increase with the reinforcement, the structure is particularly effective for use in a projection optical system of a semiconductor exposure apparatus which uses an excimer laser of KrF or ArF where absorption by the glass material is critical.

Figure 15:
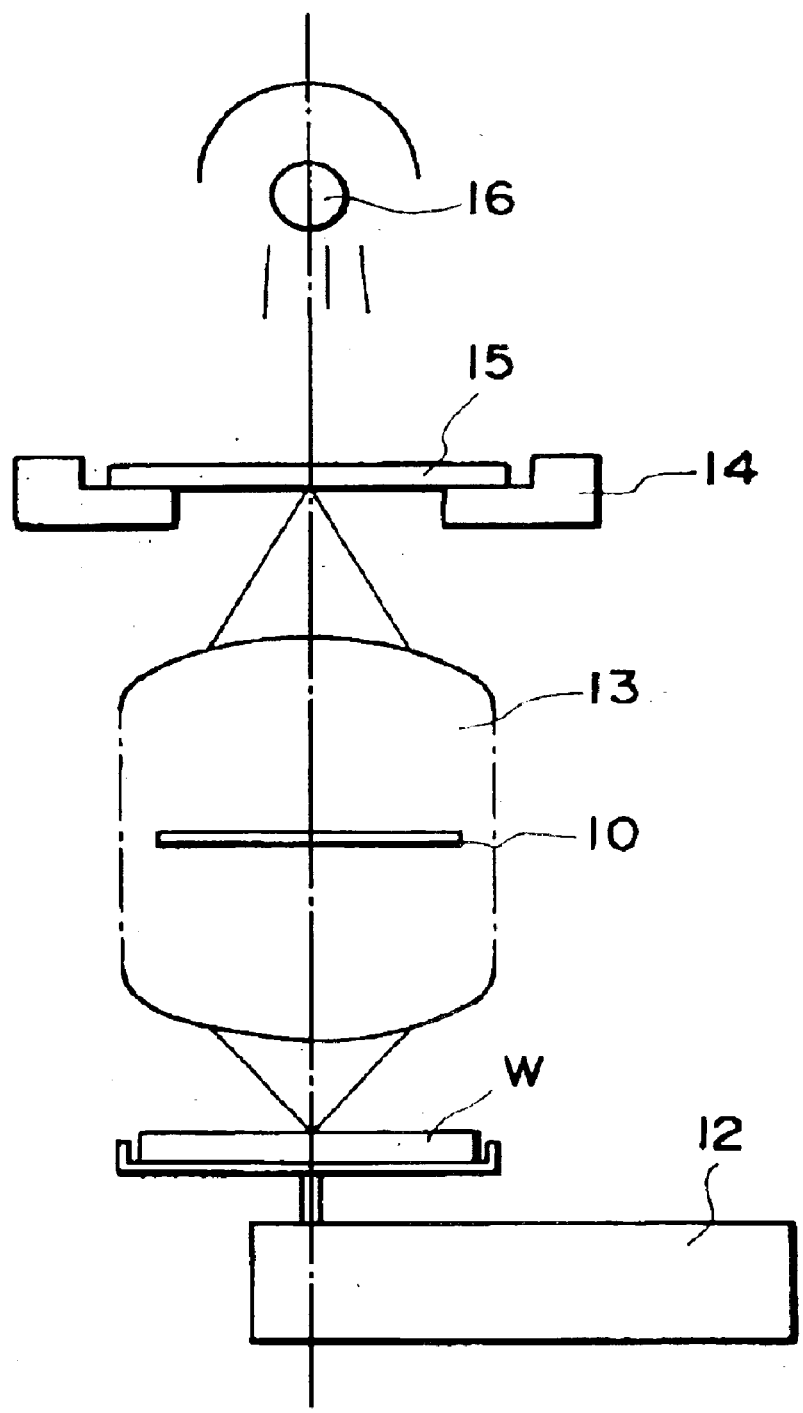
FIG. 15 is a schematic view of a main portion of an exposure apparatus with an optical unit according to one of the embodiments of FIGS. 10–14.

FIG. 15 is a schematic view of a main portion of a semiconductor exposure apparatus wherein a diffractive optical element 10 such as described above is incorporated into a projection optical system. A wafer W is placed on a stage 12 and, above the wafer W, there are a projection optical system 13, a reticle 15 as held by a holding table 14, an illumination optical system (not shown), and a light source 16, which are disposed in this order. The diffractive optical element 10 may be mounted in the projection optical system 13 through a reinforcing ring 11, or alternatively, it may be held by holding means (not shown) for holding a peripheral portion of the diffractive optical element 10 where the reinforcing ring 11 is adhered.

A pattern of the reticle 15 is projected with light from the light source 16 and through the projection optical system 13, onto the wafer W with precision. Here, since the diffractive optical element 10 has a function equivalent to a lens having a very high refractivity, as compared with an ordinary lens, use of the diffractive optical element is very effective for correction of aberrations. Also, as regards correction of chromatic aberration, an example of chromatic aberration correction based on the combination of a refraction lens and a diffractive optical element is shown in Japanese Laid-Open Patent Application, Laid-Open No. 242373/1994. Further, the diffractive optical element 10 may provide an aspherical surface effect, just by changing its pitch or shape.

Figure 16:
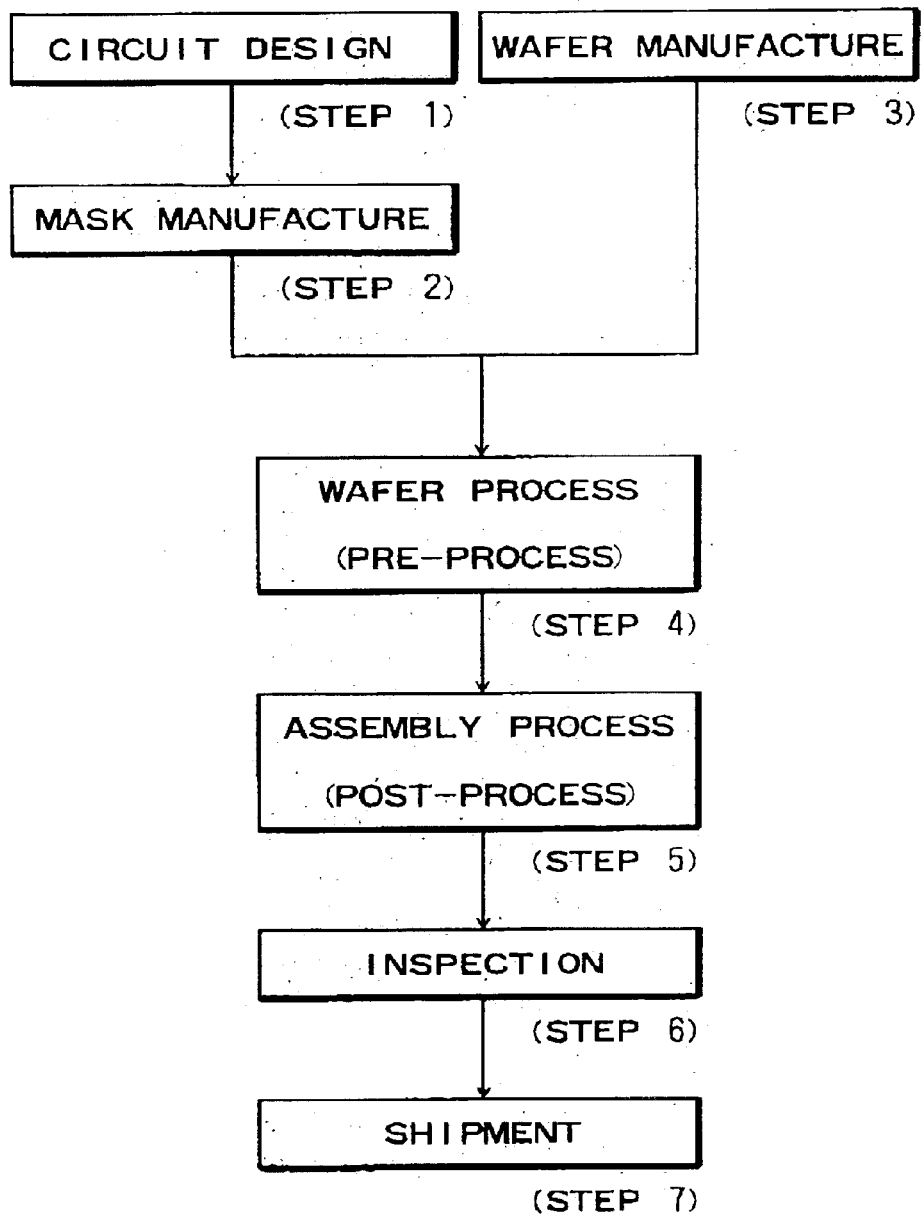
FIG. 16 is a flow chart for explaining semiconductor device manufacturing processes.

FIG. 16 is a flow chart of a procedure for the manufacture of microdevices such as semiconductor chips (e.g., ICs or LSIs), liquid crystal panels, or CCDs, for example, by use of an exposure apparatus such as shown in FIG. 9 or 15.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (which is called a pre-process) wherein, by using the so prepared mask and wafer, circuits are practically formed on the wafer through lithography. Step 5 subsequent to this is an assembling step (which is called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 17:
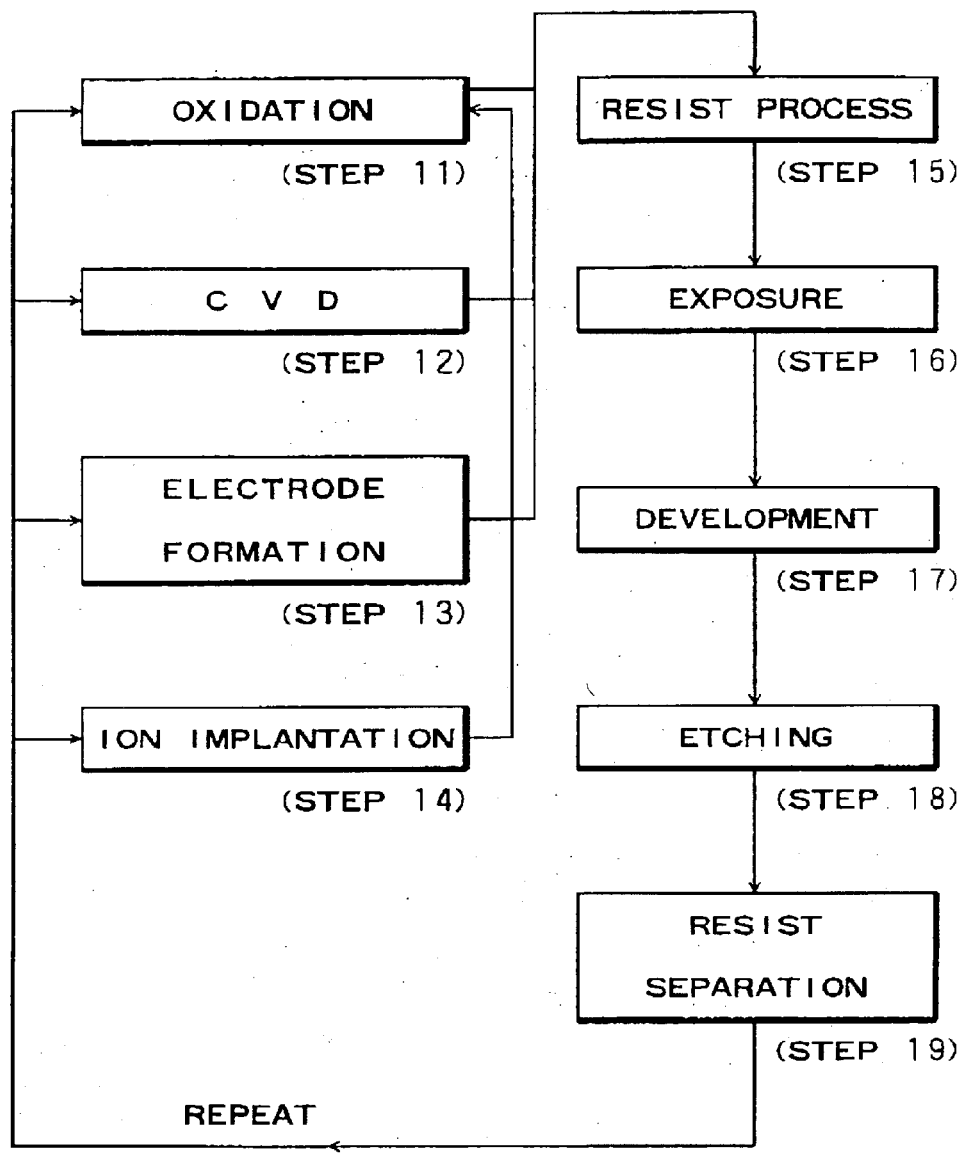
FIG. 17 is a flow chart for explaining details of a wafer process included in the procedure of FIG. 16.

FIG. 17 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

A diffractive optical element of the present invention may be applied not only to a projection optical system but also to an illumination system of a semiconductor exposure apparatus, or an optical system of any other optical instrument.

A description will now be made to further embodiments of the present invention.

Some embodiments to be described below are directed to an optical element having two or more optical members adhered or bonded together. In order to avoid creation of clearance due to an adhesive agent or degradation of flatness resulting therefrom, one or both of the bonding areas are provided with a groove which may function to reduce a residual stress to be produced by a force applied by the bonding. The groove may function to prevent creation of clearance due to an adhesive agent jutted out or degradation of flatness resulting therefrom, or may function to assure that the bonding is performed only at the groove portion.

A diffractive optical element with a micro-structure may be produced on the basis of a lithographic process as an integral structure with an optical member having a thickness, wherein one of or both of them may be formed with a groove by which deformation due to the weight or creation of residual stress and degradation of flatness can be prevented.

Specific examples of the structure of an optical element according to the present invention will be described below.

Figure 18:
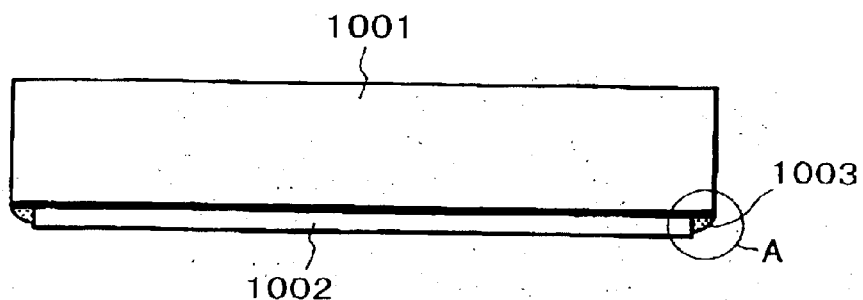
FIG. 18 is a schematic view for explaining a structure and a function thereof, according to another embodiment of the present invention.

FIG. 18 is a sectional view of a main portion of a further embodiment of the present invention. Denoted in the drawing at 1001 is a parallel plane plate made of quartz and having a thickness of 10–30 ml. Denoted at 1002 is a diffractive optical element defined on a quartz water, and denoted at 1003 is an adhesive agent. The illustration is a sectional view taken along a diametrical direction passing through the center of the parallel flat member 1001.

Figure 19A:
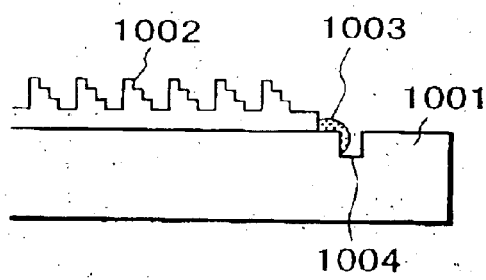
FIGS. 19A, 19B, 19C and 19D are schematic views, respectively, for explaining examples according to the embodiment of FIG. 18.
Figure 19B:
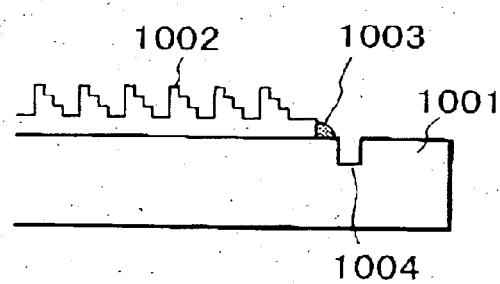

FIGS. 19A–19D are schematic views, respectively, each showing in enlargement the portion A of FIG. 18. In these drawings, denoted at 1003 is an adhesive agent, and denoted at 1004 is a groove (groove for receiving the adhesive agent.) In FIGS. 19A and 19B, the diffractive optical element 1002 is illustrated as being a four-level binary optics arrangement which may be determined through approximation based on quantization of a Kinoform. However, the invention is not limited to the quantization number (level number) of binary optics. Thus, a Fresnel lens with a blazed shape may be used, with a result of advantageous effects of the present invention.

Figure 22:
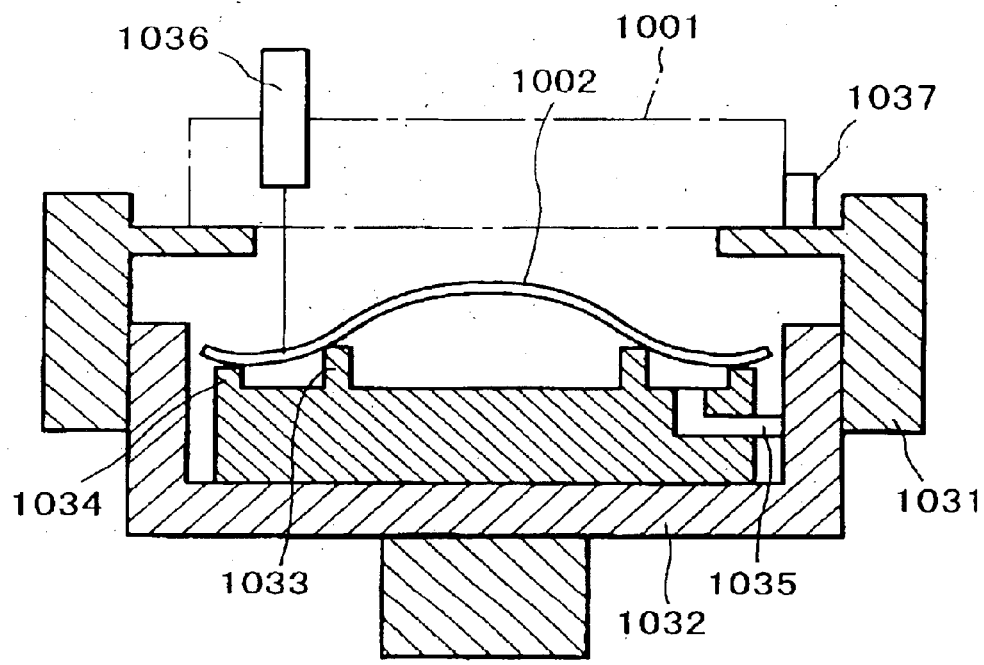
FIG. 22 is a schematic view for explaining a bonding process for the embodiments of FIGS. 18 and 20.

FIG. 22 illustrates the bonding process. Denoted in this drawing at 1001 is a parallel plane substrate, and denoted at 1002 is a diffractive optical element defined on a quartz wafer. Denoted at 1031 is a parallel plane plate holder, and denoted at 1032 is a diffractive optical element chuck. Denoted at 1033 is a protrusion (a) of ring-like shape, and denoted at 1034 is another protrusion (b) of ring-like shape. Denoted at 1035 is a discharging outlet port, and denoted at 1036 is a scope. The quartz wafer 1002 is placed on the diffractive optical element chuck 1032 having a position measurement mark formed thereon, and the wafer is adjusted so that the center of the diffractive optical element 1002 is aligned with the center of the chuck 1032. A negative pressure is applied from the outlet port 1035, by which the wafer is held there by attraction. The centering of the diffractive optical element 1002 may be performed by using the pattern of the diffractive optical element itself, or it may be made on the basis of a specific mark provided therefor. After completion of measurement, the scope 1036 is moved out of the bonding device to a place not interfering with the bonding operation. Because of the ring-like protrusions (a) and (b) described above, the quartz wafer 1002 deforms into a convexed shape. Although the amount of deformation is practically small, it is illustrated with exaggeration for ease in understanding. The parallel plane plate holder 1031 is provided with a three-point abutment 1037 so as to register the center of the substrate, as held by the holder, with the center of the chuck 1032. After completion of center alignment between the diffractive optical element 1002 and the parallel plane plate 1001, the plate 1001 is first brought into contact with the center of the diffractive optical element 1002. By releasing the pressure at the discharging outlet port 1035 gradually to the atmospheric pressure, the deformation is released so that the diffractive optical element 1002 gradually contacts the parallel plane plate 1001, whereby they are directly bonded with each other.

The diffractive optical element 1002 defined on a quartz wafer is thus in optical contact to the parallel plane member 1001. Here, the term optical contact refers to direct bonding of substrates without intervention of an adhesive agent or the like, and it may include vacuum bonding, for example. Here, the bonding surface may be formed with an anti-reflection (AR) coating, for reducing reflection at the bonding surface.

As shown in FIGS. 19A–19D, the parallel plane member 1001 and the diffractive optical element 1002 are adhered at their peripheral portions, by using an adhesive material 1003 which may be an epoxy series adhesive agent, for example. The adhesive material may be a methacrylic series or polyester series adhesive agent, or may be an organic series or inorganic series adhesive agent. The diffractive optical element 1002 defined on the quartz wafer is very thin (with a thickness of a few millimeters or less) and, in consideration of it, the groove 1004 is formed at the periphery so that the adhesive agent does not extend onto the diffractive pattern.

In this embodiment, depending on the quantity of the adhesive agent 1003 used, it may extend into the groove 1004 as shown in FIG. 19A, or it may not extend into the groove 1004 as shown in FIG. 19B.

Figure 19C:
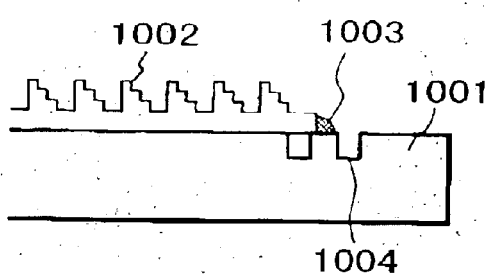

In accordance with the optical contact, there may occur a non-contact portion, particularly in the outermost peripheral region. Therefore, in order to avoid that the adhesive agent extends into the interface of optical contact, the groove 1004 may be formed at the place closer to the center as compared with the adhesive agent but outside the effective diameter, as shown in FIG. 19C.

Figure 19D:
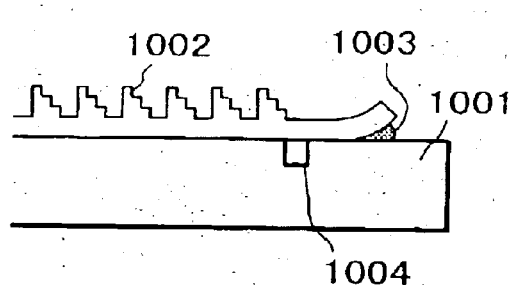

Alternatively, as shown in FIG. 19D, the non-contact portion created in the optical contact may be bonded by using an adhesive agent. Also, on such an occasion, the groove 1004 may be formed at the place closer to the center as compared with the adhesive agent but outside the effective diameter.

In the structure described above, bonding the periphery by adhesion applies a basic fixed strength to the diffractive optical element 1002 and the parallel plane member 1001. Also, it applies the function of vacuum sealing to a vacuum ambience where vacuum bonding is used. The surface of the diffractive optical element 1002 having the blazed shape may be used as the contact surface. Placing the clearance in a vacuum state effectively assures intimate contact of the central portion of the diffractive optical element to the optical material, even in a case where the diffractive optical element is disposed downstream of the optical material within a projection optical system.

While this embodiment has been described with reference to examples of optical contact for the adhesion of the central portion of the optical member, the whole surface may be adhered by using an adhesive agent or, alternatively, only the peripheral portion may be adhered without the whole surface adhesion.

Where only the peripheral portion is to be adhered, the groove 1004 should be formed at a place closer to the center than the adhesive agent and outside the effective diameter, as shown in FIG. 19C.

With the bonding procedure such as described above, a diffractive optical element formed like a thin wafer can be made integral with another optical member, with a result of sufficient bonding strength as well as protection of the surface of the diffractive optical element.

Figure 20:
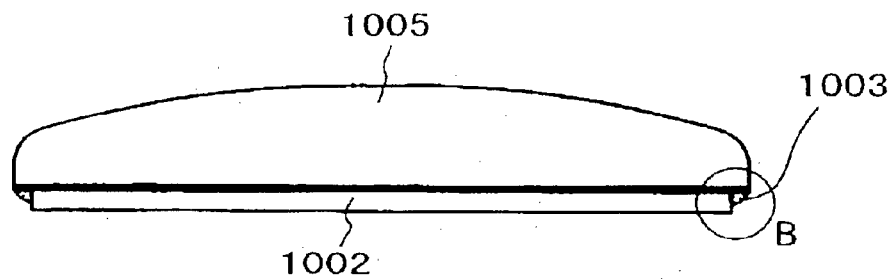
FIG. 20 is a schematic view for explaining a structure and a function thereof, according to a further embodiment of the present invention.

FIG. 20 is a schematic view of a main portion of a further embodiment of the present invention. Denoted in FIG. 20 at 1005 is a plane-convex lens made of quartz, and denoted at 1002 is a diffractive optical element defined on a quartz wafer. Denoted at 1003 is an adhesive agent. The illustration of FIG. 20 is a sectional view taken along a diametrical direction, passing through the center. The plane-convex lens 1005 and the diffractive optical element 1002 are bonded by optical contact, like the preceding embodiment.

Figure 21A:
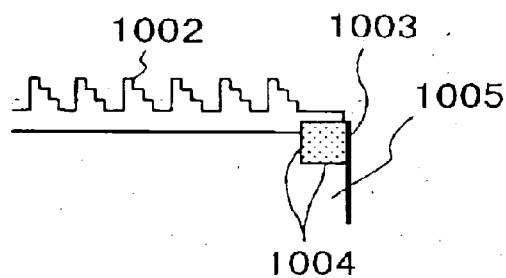
FIGS. 21A and 21B are schematic views, respectively, for explaining examples according to the embodiment of FIG. 20.
Figure 21B:
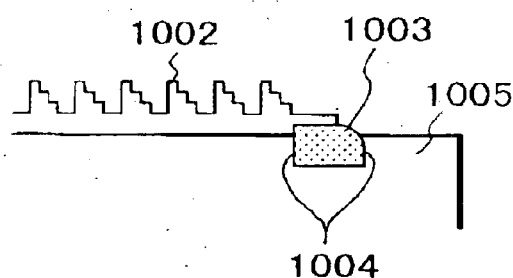

FIGS. 21A and 21B are enlarged views of the portion B of FIG. 20. The adhesive agent 1003 is provided by an inorganic series adhesive material of a low-melting-point glass. The low-melting-point glass has good characteristics such as a thermal expansion coefficient, for example, with respect to adhesion of glasses. Thus, in combination with the attracting force of vacuum ambience, creation of unwanted stress or the like due to a change in environmental temperature or a change in temperature resulting from absorption of light by the lens itself can be suppressed.

As shown in FIG. 21A or 21B, both of the plane-convex lens 1005 and the diffractive optical element 1002 may be formed with grooves 1004, defining the adhesion area. When a metal eutectic crystal (Au and Al) is used as an example of inorganic series adhesion, both of the diffractive optical element 1002 and the plane-convex lens 1005 may be formed with grooves of a depth corresponding to the thickness (e.g., about 0.1 micron) of the vapor deposition of one metal (Au or Al) for the eutectic crystal. Metal films may be deposited on theses grooves, and the bonding based on the eutectic crystal may be performed. Another example of the bonding process may be anodic bonding. A glass with ions and an electrically conductive film may be formed in the film, and the bonding may be made through application of an electric field. The plane-convex lens 1005 or the diffractive optical element 1002 may be a glass with ions. As shown in FIG. 21A, the grooves may be formed only at the bonding area, or, as shown in FIG. 21B, the groove on the plane-convex lens side may be formed wide.

While the embodiment has been described with reference to examples of optical contact for the adhesion of the central portion, the adhesion may be made over the whole surface or may be made only at the peripheral portion. Where the whole surface adhesion is to be made, an inorganic series adhesion process based on melting boding of a material, easily usable with respect to optics, may be used. Examples of materials to be sued for the melting bonding are quartz, $CAF_2$, MgF and LiF.

A diffractive optical element 1005 may be bonded to a plane-convex lens 1005 of quartz, similarly, as shown in FIG. 20B.

With the bonding procedure such as described above, a diffractive optical element formed like a thin wafer can be made integral with another optical member, with a result of sufficient bonding strength as well as protection of the surface of the diffractive optical element.

The inorganic series bonding is effective to prevent a decrease of efficiency due to degradation of the adhesive agent, for example. Further, in the structure described above, the optical material that assures the strength may be provided by a lens which constitutes a projection optical system. It effectively contributes to reduction in total thickness of the optical members in the whole projection optical system, and minimizes the absorption of illumination light.

Figure 23A:
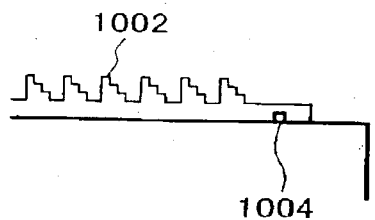
FIGS. 23A and 23B are schematic views, respectively, for explaining a structure and a function thereof, according to a still further embodiment of the present invention.
Figure 23B:
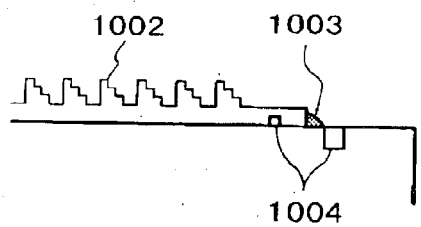

FIGS. 23A and 23B are sectional views, respectively, of a main portion of a yet further embodiment of the present invention. Denoted in the drawings at 1007 is a plane-concave lens, and denoted at 1002 is a diffractive optical element defined on a quartz wafer. Denoted at 1003 is an adhesive agent. The plane-concave lens 1007 and the diffractive optical element 1002 are bonded with each other by optical contact.

As shown in FIG. 23A, a groove 1004 is formed on the diffractive optical element 1002 side, so as to release distortion which may be produced at the bonding. However, there may be plural grooves formed. That is, where the bonding is to be made by using an adhesive agent, as shown in FIG. 23B, a groove 1004 may be formed on the diffractive optical element 1002 side so as to release the distortion which may be produced at the bonding and, additionally, another groove 1004 may be formed on the plane-concave lens 1007 to prevent extension of the adhesive agent. On that occasion, any residual stress created by the force applied at the bonding can be reduced and, in addition thereto, the surface of the diffractive optical element can be protected. The bonding strength may increase as a result.

Figure 24A:
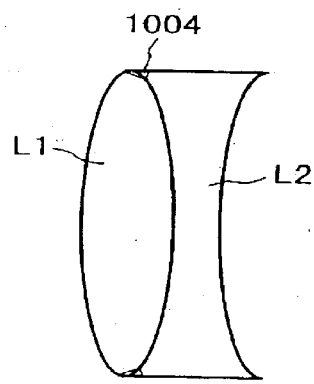
FIGS. 24A and 24B are schematic views, respectively, for explaining a structure and a function thereof, according to a yet further embodiment of the present invention.
Figure 24B:
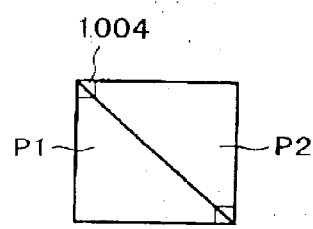
Figure 25A:
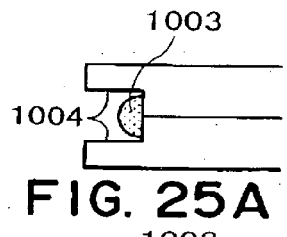
FIGS. 25A, 25B, 25C, 25D, 25E and 25F are schematic views, respectively, for explaining examples according to the embodiment of FIGS. 24A and 24B.
Figure 25B:
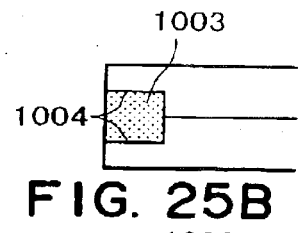
Figure 25C:
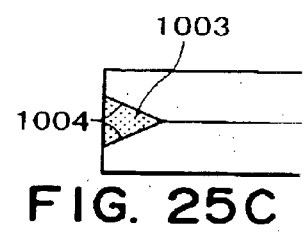
Figure 25D:
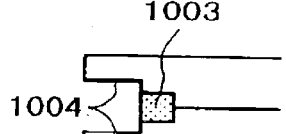
Figure 25E:
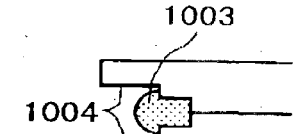
Figure 25F:
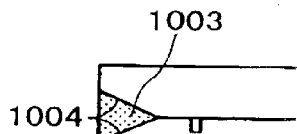

FIGS. 24A and 24B are schematic views, respectively, of a main portion of a still further embodiment of the present invention. FIG. 24A shows a case where lenses L1 and L2 are bonded with each other, and FIG. 24B shows a case where prisms P1 and P2 are bonded with each other. The bonding procedure may use adhesion of organic series or inorganic series such as described hereinbefore, or it may use optical contact as described above. A groove for adhesive agent may be formed outside the effective diameter, and, by using an adhesive agent, the bonding strength may be improved. Depending on the bonding process used, the shape of the groove or the stage of the bonding agent may be such as shown in FIGS. 25A–25F. As shown in FIG. 25F, a groove for preventing extension of adhesive agent may be provided.

The provision of such a groove is effective to prevent creation of clearance or degradation of flatness due to jutting-out of the adhesive agent, and assures that the bonding is made only at the groove areas, whereby several inconveniences can be avoided.

In accordance with the present invention, an optical member such as a diffractive optical element as described above may be incorporated into a portion of an optical system of an exposure apparatus such as shown in FIG. 9, and devices may be produced by using it.

Further embodiments of the present invention will be described below with reference to FIGS. 26–58.

FIG. 26 is a sectional view of another embodiment. In this embodiment, a transparent quartz material of circular or approximately circular shape with a diameter 200 mm and a thickness 20 mm is used to provide a parallel plane plate 2020 which is completely or approximately free from deformation due to any external force. A diffractive optical element 2021 having a straight or ring-like diffraction grating defined on a transparent quartz water of a diameter 200 mm and a thickness 0.725 mm, is directly bonded to the bottom face of the parallel plate 2020 by optical contact, in the manner that the grating-formed face is covered thereby. It is held by a holder 2022, and is incorporated into an optical system. The thus bonded optical element shows an optical performance substantially the same as of a diffractive optical element having a diffraction grating defined on a substrate of a thickness 20.725 mm. Also, since the rigidity is proportional to the cube of the thickness and inversely proportional to the weight, as compared with a case where it is not bonded to the parallel plane plate 2020, the rigidity is about 817 times stronger so that a sufficient strength is assured.

FIGS. 27 and 28 are enlarged and sectional views, respectively, of a region A of FIG. 26. The diffractive optical element 2021 has a fine surface-step pattern formed with precision through an ordinary semiconductor process. In FIGS. 27 and 28, this diffractive optical element 2021 is illustrated as being a quantized and approximated four-level binary optics arrangement. However, the number of quantization (number of levels) of the binary optics is not limited to four, and an eight-level or sixteen-level structure may be used. Alternatively, a Kinoform with blazed shape may be used, with substantially the same optical effect.

FIG. 27 shows a case where the plane opposite to the face of the element 2021 where the surface-step pattern is formed is bonded to the parallel plane plate 2020. This example is advantageous with respect to the strength since the bonding area is large. On the other hand, as shown in FIG. 28, the bonding of the element 2021 may be made at the face where the surface-step pattern is formed. On that occasion, deposition of dust or foreign particles to the surface-step pattern can be prevented, and thus the cleaning may be easy. An anti-reflection film of single-layer structure or multilayered structure may be formed at the bonding face. The topmost layer of such anti-reflection film may be provided by an oxide such as alumina, particularly, $SiO_2$, with a result of easy adhesion with the parallel plate 2020.

FIG. 29 is a sectional view of a bonding device. Fixedly mounted on a rotatable fixing tool 2023 is a diffractive optical element chuck 2024. Two, large and small, ring-like protrusions 2025 and 2026 having different diameters are formed on the top face of the chuck 2024, the protrusions being protruded upwardly. Between these protrusions 2025 and 2026, there is a discharging outlet port 2027. The protrusion 2025 is made slightly lower than the protrusion 2026. Mounted on the outside peripheral surface of the fixing tool 2023 is a parallel plane holder 2029 of generally cylindrical shape, having a three-point abutment 2028. The parallel plane plate 2020 can be engaged with this abutment 2028, by which the center of the parallel plate 2020 placed on the holder 2029 can be brought into alignment with the center of the chuck 2024. Disposed above the chuck 2024 is a position measuring mark scope 2030.

The diffractive optical element 2021 provided by a quartz wafer having a diffraction grating is placed on the chuck 2024, and, while observing the position measuring mark on the diffractive optical element 2021 through the mark scope 2030, the relative position is adjusted so that the center of the diffractive optical element 2021 is aligned with the center of the chuck 2024. Then, air is discharged through the outlet port 2027, by which the diffractive optical element 2021 is attracted to the protrusions 2025 and 2026. In response, the diffractive optical element 2021 deforms very small into a convexed shape. The centering of the diffractive optical element 2021 may be made by using the grating pattern itself, not by using a specific mark. The mark scope 2030 is moved out of the bonding device after the measurement, to a position not interfering with the bonding process.

After completion of alignment between the centers of the diffractive optical element 2021 and the parallel plate 2020, the plate holder 2029 is moved downwardly. Then, the parallel plate 2020 first contacts the center of the diffractive optical element 2021. Subsequently, air is discharged through the outlet port 2027 so as to gradually turn the negative pressure to the atmospheric pressure, by which the deformation of the diffractive optical element 2021 is released. By this, the contact area between the diffractive optical element 2021 and the parallel plate 2020 increases gradually, and finally they are directly bonded with each other throughout the whole surface.

Figure 30B:
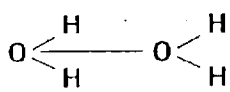

The direct bonding method such as described above is called "optical contact". It is the bonding method which is based on a hydrogen bond between quartz and water, water and water or fluorite and water, for example (FIG. 30A), or which is based on direct bond of optical members through the van der Waals force (FIG. 30B). This method enables bonding of optical members such as glass or quartz without use of an adhesive agent or the like. Here, in order to obtain a sufficient strength, the surface roughness of the bonding faces of the parallel plane plate 2020 and the diffractive optical element 2021 may preferably be kept at 5 nm or less in the mean square and the water content my preferably controlled to $10^{13}$ molecule/cm² or more.

Generally, a very small clearance h (FIG. 31) is present at the bonding area. When r is the radius, γ is the surface energy, E is the modulus of elasticity, and t is the thickness, the direct bonding is possible as long as they are in a range satisfying the following relation:

$$h/r^2 < (\gamma E/t^3)^{1/2} \quad (10)$$

Equation (10) above concerns a case where there is a clearance h at a single location. However, throughout the whole substrate of a diameter 200 mm, there may be a large number of clearances, and it is seen that the surface roughness which may be measured by AMF, for example, and the water content which may be measured by APIMS, for example, may provide a reference. Thus, in order to keep the surface roughness at the diffractive optical element 2021 surface, the diffractive optical element 2021 should be treated by polishing, for example, before it is treated by the semiconductor process, to keep a certain substrate surface roughness. Similarly, during or after the treatment, careful attention should be paid to hold the surface roughness.

As regards the surface energy γ, for an ordinary quartz substrate, it is possible to keep the water content at $10^{13}$ molecule/cm² and, therefore, a sufficient surface energy γ can be kept. If, however, the surface is contaminated, the surface energy γ may become insufficient. In the case of a hydrophilic material such as quartz, the water content may be recovered by using a chemical liquid or using ultraviolet-ray or ozone washing. For a hydrophobic material, after the washing, water may further be blown against it or any hydrophilic liquid treatment may be made to it, to thereby keep the water content.

By preparing such substrates and by making the bonding of them with use of the bonding device such as shown in FIG. 29, they can be bonded to each other through hydrogen bond or the van der Walls force. Here, if excessive water remains between the substrates, the bonding strength becomes weak to the contrary. Therefore, the water content may preferably be adjusted before the bonding operation and, additionally, a drying treatment at a normal temperature or a heating treatment may preferably be made after the bonding operation, to reduce the water content. The elimination of contained water may occur at a temperature of about 200–400° C. and, idealistically, the state such as shown in FIG. 32 may result. Practically, however, since there are clearances between the substrates, there may remain water corresponding to about a few molecules such as shown in FIG. 33. The bonding strength here may be about 10 Kg/cm² and, depending on the manner of use, the strength may become insufficient. In consideration of it, reinforcement may preferably be made at the outside peripheral portion outside the effective diameter, by using an adhesive agent. Alternatively, heating at a temperature of 400–1000° C. may be made to produce a dehydration contraction reaction to substitute the hydrogen bond by covalent bond, to thereby enlarge the bonding strength.

As regards the optical characteristic at the bonding face, it is desirable that the loss of reflection factor and transmission factor in the wavelength used is held at 0.1% or less. If there are foreign particles remaining or a large quantity of air or water present, the optical performance may not be maintained. For this reason, the substrate control before the bonding is important not only in respect to the bonding strength but also in regard to the optical characteristic.

While in this embodiment the same material of quartz is used both for the diffractive optical element 2021 and the parallel plane plate 2020, an oxide such as alumina or a fluoride such as calcium fluoride, lithium fluoride, barium fluoride, magnesium fluoride, or strontium fluoride, for example, may be used for the parallel plane plate 2020, to provide an optical member for use with a short wavelength. As regards an optical member for use with a long wavelength, a glass material or a plastic material may preferably be used for the parallel plane plate 2020 to be bonded. Further, for a diffractive optical element for use in a catoptric system, metal or ceramics such as SiN or SiC, for example, may be used. However, use of the same material enables easy bonding since the surface state to which hydrogen is to be supplied, such as distribution spacing of O—H radical, for example, is the same.

In the manner described above, an optical element with a fine grating pitch, having a double rigidity or more, can be manufactured with good precision. It can be free from the influence of any external force. Thus, when combined into an optical system, it shows a good optical performance. Further, since direct bonding based on hydrogen bond or van der Waals force is used, the optical element can be used stably in an optical system for use with light of a short wavelength.

As a modified example of the embodiment of FIG. 26, a diffractive optical element 2021 having a diffraction grating defined on a quartz wafer of a diameter 300 mm and a thickness 0.775 mm may be bonded, by direct bonding as in the preceding embodiment, to a parallel plane plate 2020 of a diameter 300 mm and a thickness 30 mm. Then, it may be incorporated into an optical system, while being held by a holder 2022. This optical element may provide an optical performance substantially the same as a diffractive optical element of a thickness 30.775 mm, and the rigidity thereof is about 1577 times higher.

Figure 34:
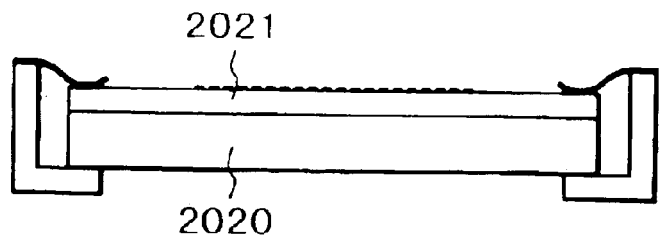
FIGS. 34, 35, 36, 37, 38, 39 and 40 are schematic views, respectively, for explaining examples of bonding.
Figure 35:
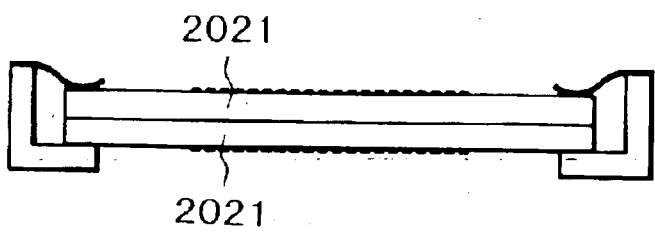
Figure 36:
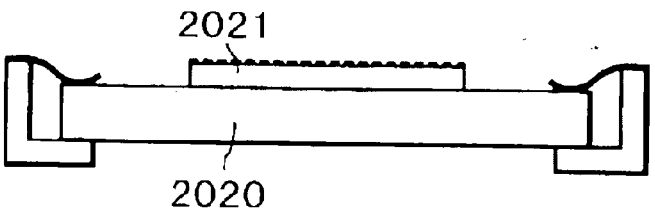
Figure 37:
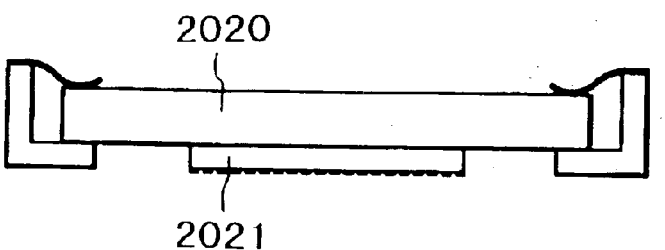

Further, as shown in FIG. 34, a diffractive optical element 2021 may be directly bonded to a parallel plane plate 2020 with the diffraction grating surface thereof facing up. Alternatively, as shown in FIG. 35, two diffractive optical elements 2021 may be bonded together at their surfaces opposite to the surfaces on which their diffraction gratings are formed. As further alternatives, as shown in FIGS. 36 and 37, a diffractive optical element 2021 may be bonded, by direct bonding, to a central portion of a parallel plane plate 2020 without contact to the peripheral portion thereof, and the peripheral portion may be held by a holder.

Figure 38:
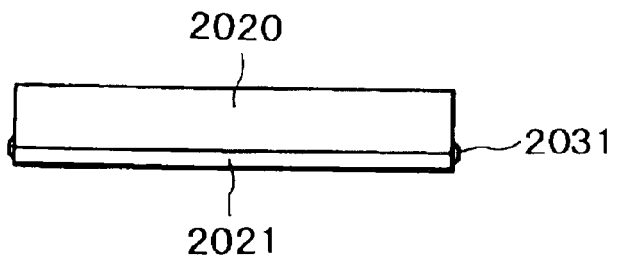
Figure 39:
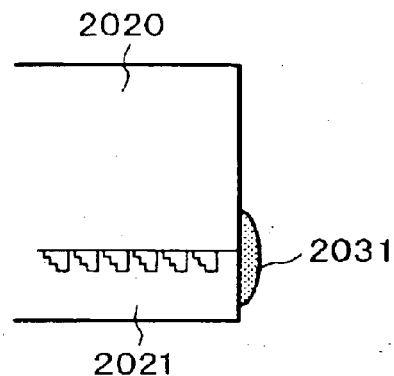

FIG. 38 shows another bonding method wherein the peripheral portions are bonded together by using an adhesive agent. More specifically, the outer circumferential side faces of a parallel plane plate 2020 and a diffractive optical element 2021 may be joined together by an adhesive agent 2031. FIG. 39 is an enlarged view of the bonding area of FIG. 38.

Figure 40:
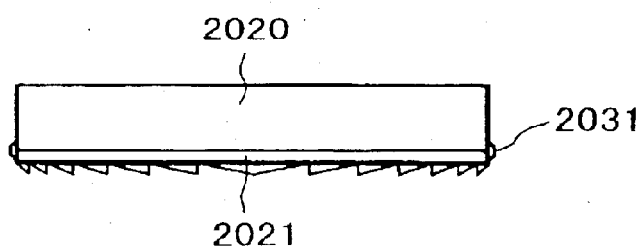

FIG. 40 shows an example wherein the surface of a diffractive optical element 2021, opposite to the surface thereof where its diffraction grating is formed, is bonded to a parallel plane plate 2020.

Figure 41:
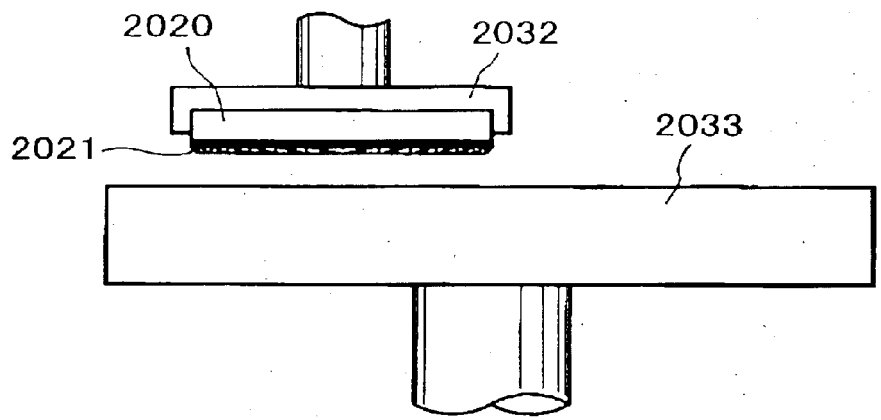
FIG. 41 is a schematic and side view for explaining the bottom surface processing.

A diffractive optical element 2021 as bonded to a parallel plane plate 2020 having a sufficient thickness to obtain a sufficient strength, can be easily polished at its bottom face. More specifically, as shown in FIG. 41, in a case where a workpiece is held by a work chuck 2032 and is polished by using a lapping machine, it requires a very complicated control to keep a constant machining pressure as long as the workpiece is a very thin wafer. Once the diffractive optical element 2021 is bonded to the parallel plane plate 2020 and a sufficient rigidity is assured, the bottom face thereof can be treated easily. In an optical element in which the grating surfaces are bonded together, the surface-step pattern can be protected against deposition of dust or foreign particles. Further, after the bonding, both of the opposite surfaces of the element are flat and, therefore, the cleaning is easy. Also, creation of unwanted stress due to a temperature change can be reduced.

Figure 42:
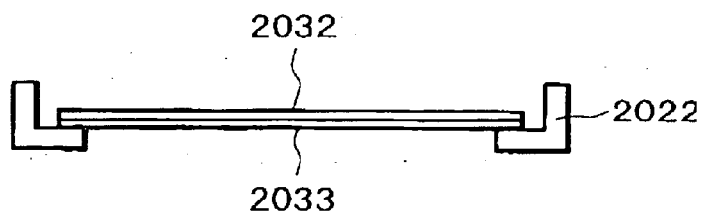
FIGS. 42, 43, 44, 45, 46, 47, 48, 49, 50, 51, 52, 53, 54, 55, 56, and 57 are schematic and sectional views, respectively, of diffractive optical elements according to further embodiments of the present invention, respectively.

FIG. 42 is a sectional view of another embodiment. A parallel plane plate 2032 made of quartz and having a diameter 200 mm and a thickness 0.725 mm and a diffractive optical element 2033 provided by a quartz wafer of a diameter 200 mm and a thickness 0.725 mm are bonded together in accordance with the direct bonding method like that of the embodiment of FIG. 26. It is then incorporated into an optical system while being held by a holder 2022. As a result, the element 2033 shows an optical performance substantially the same as that of a diffractive optical element of a thickness 1.45 mm, and a rigidity of about four times higher as compared with a case where it is not bonded to the plate 2032.

Figure 43:
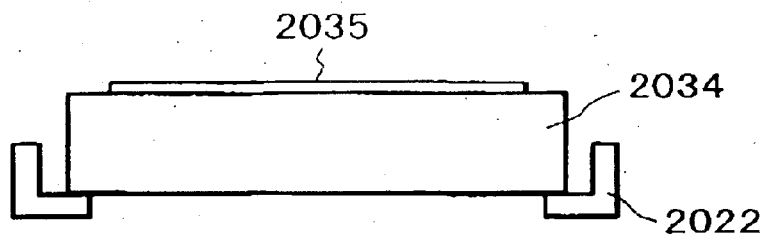

FIG. 43 is a sectional view of a further embodiment. A parallel plane plate 2034 made of quartz and having a diameter 180 mm and a thickness of 5–20 mm and a diffractive optical element 2035 provided by a quartz wafer of a diameter 150 mm (6 inches) and a thickness 0.625 mm, are incorporated into an optical system while being held by a holder 2022. In the case where, as in this example, the parallel plane plate 2034 is disposed below the diffractive optical element with respect to the gravity force direction, either they may be bonded together or may not be bonded with each other. Also, while the outer diameter may preferably be about 180 mm, since the range through which the light passes actually will be a diameter not greater than 150 mm, a quartz wafer of a standard size of 150 mm may be used and it may be treated by a semiconductor process. Since in that occasion there is no necessity of machining the outside diameter after formation of a fine pattern, deposition of dust or particles due to the cutting operation or the like can be avoided.

Figure 44:
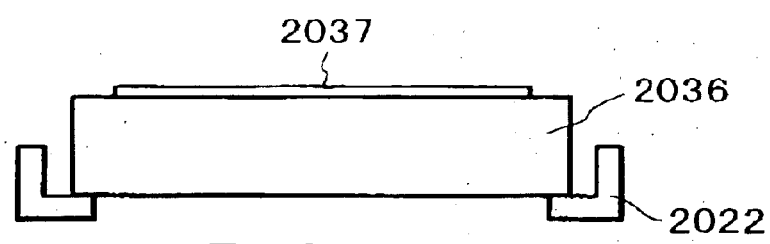

FIG. 44 is a sectional view of a further embodiment A parallel plane plate 2036 made of fluorite ($CaF_2$) and having a diameter 170 mm and a thickness 30 mm and a diffractive optical element 2037 provided by a quartz wafer of a diameter 150 mm (six inches) and a thickness 0.625 mm are bonded together in accordance with the direct bonding method like that of the embodiment of FIG. 26. It is then incorporated into an optical system while being held by a holder 2022. If the parallel plane plate 2036 is disposed below the diffractive optical element 2037 with respect to the gravity force direction, like the embodiment of FIG. 43, either they may be bonded together or they may not be bonded to each other. To the contrary, the diffractive optical element 2037 may be disposed below the parallel plate with respect to the gravity force direction and may be bonded thereto by direct bonding. The bonding area may be on the surface where the surface-step pattern is formed, or it may be on the surface where such pattern is not formed. When the direct bonding is to be executed, a bonding device such as shown in FIG. 29 may be used and the bonding may be made on the basis of hydrogen bond or van der Waals force. Since fluorite is higher in polarity than quartz, ion bond may be included. Also, since the transmission factor at the shorter wavelength side is higher, an element of larger thickness may be used.

Figure 45:
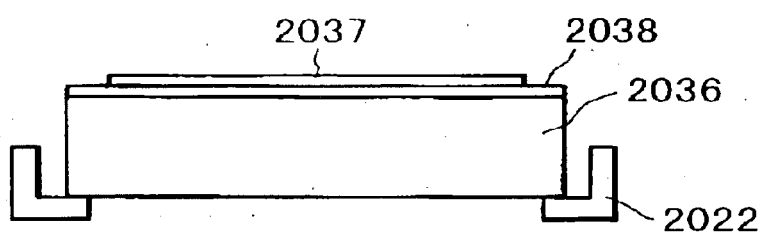
Figure 46:
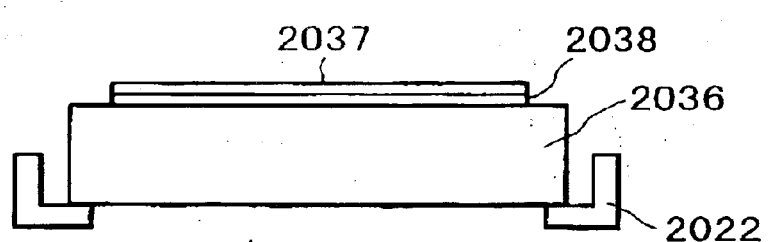
Figure 47:
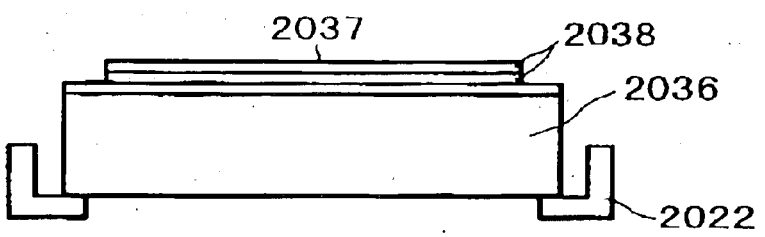

As shown in FIGS. 45–47, an anti-reflection film 2038 of a single-layer structure or a multilayered structure may be provided at the bonding area. FIG. 45 shows an example where an anti-reflection film 2038 is formed on a parallel plane plate 2036 made of fluorite. The topmost layer of this anti-reflection film 2038 may comprise an oxide such as alumina or $SiO_2$, for example. This enables easy bonding since, in that occasion, the state of the surface to which hydrogen is to be supplied and of the diffractive optical element 2037 made of quartz is closer as compared with the distribution spacing of the O—H radical, for example.

FIG. 46 shows an example where an anti-reflection film 2038 is formed on a diffractive optical element 2037 made of quartz. The topmost layer of this anti-reflection film 2038 may comprise a fluoride such as calcium fluoride, lithium fluoride, barium fluoride, magnesium fluoride, or strontium fluoride, for example. This enables easy bonding since, in that occasion, the state of the surface to which hydrogen is to be supplied and of the parallel plane plate made of fluorite is closer as compared with the distribution spacing of the O—H radical, for example.

FIG. 47 shows an example where both of a diffractive optical element 2037 made of quartz and a parallel plane plate 2036 made of fluorite are provided with anti-reflection films 2038. The topmost layers of these anti-reflection films 2038 may be made of the same material or materials of the same series, that is, oxides or, alternatively, fluorides, for example. This enables easy bonding since, in that occasion, the state of the surface to which hydrogen is to be supplied (e.g., distribution spacing of the O—H radical) is the same.

Figure 48:
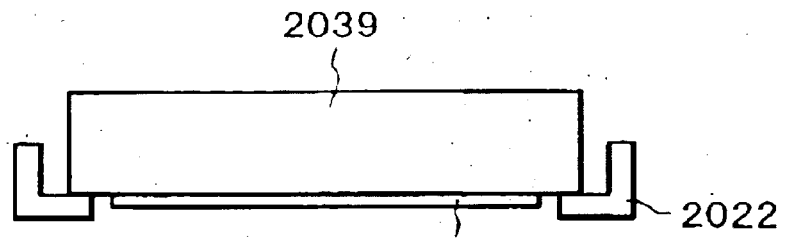

FIG. 48 is a sectional view of a still further embodiment. A parallel plane plate 2039 made of fluorite and having a diameter 220 mm and a thickness 20 mm and a diffractive optical element 2040 provided by a fluorite wafer of a diameter 200 mm (eight inches) and a thickness 0.725 mm are bonded together in accordance with the direct bonding method like that of the embodiment of FIG. 26. It is then incorporated into an optical system while being held by a holder 2022. In this case, the diffractive optical element 2040 may be disposed below with respect to the gravity force direction. If direct bonding is to be executed, a bonding device such as shown in FIG. 29 may be used and the bonding may be made on the basis of hydrogen bond or van der Waals force. Since fluorite is higher in polarity than quartz, the proportion of ion bond is larger. Also, since the transmission factor thereof in the shorter wavelength region is higher, an element of larger thickness and a shorter wavelength may be used. In a case where short wavelength light of a wavelength not greater than 170 nm, such as $F_2$ laser light (157 nm) for example, is to be used, use of fluorite or a fluoride such as magnesium fluoride may be advantageous in respect to the transmission factor, for example.

FIGS. 49–52 are sectional views of further embodiments, respectively. A diffractive optical element 2041 having a diffraction grating defined on a quartz wafer or a fluorite wafer with a diameter 200 mm (eight inches) and a thickness 0.725 mm, is used. A supporting member to which the optical element is to be bonded may comprise a plane-convex lens, a plane-concave lens, a plane-aspherical lens, a prism, or a mirror, for example.

Figure 49:
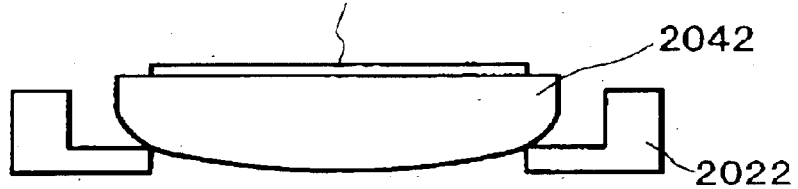
Figure 50:
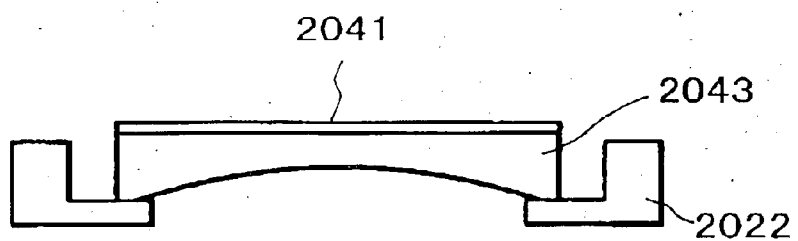
Figure 51:
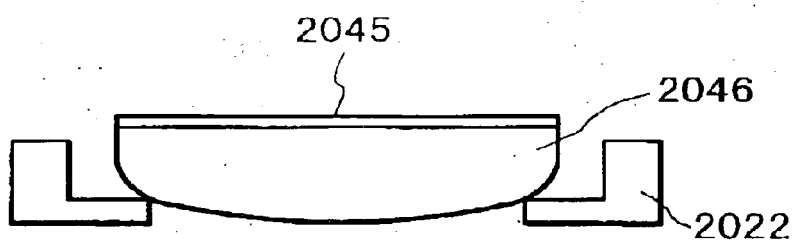
Figure 52:
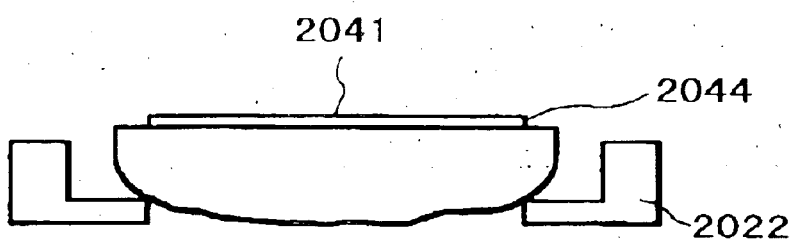

FIG. 49 shows an example wherein the optical element 2041 is bonded to a plane-convex lens 2042 made of a fluorite material with a diameter 220 mm. FIG. 50 shows an example where the optical element 2041 is bonded to a plane-concave lens 2043 made of quartz and having a diameter 200 mm. FIG. 52 shows an example where the optical element 2041 is bonded to a plane-aspherical lens 2044 made of a fluorite material and having a diameter 200 mm. FIG. 51 shows an example where a diffractive optical element 2045 comprising a rectangular substrate of a size 150×200 mm, being made of quartz and having a thickness 0.725 mm, and a cylindrical lens 2046 of a size 150×200 mm being made of quartz, are bonded together.

In the examples of FIGS. 49–52, like the embodiments described hereinbefore, either the two members may be bonded together by direct bonding or they may not be bonded with each other. By combining the optical element with another member having an optical characteristic as described above, not only a sufficient rigidity is assured but also an increase in the optical path length of the glass materials of the whole optical system can be reduced or suppressed.

Figure 53:
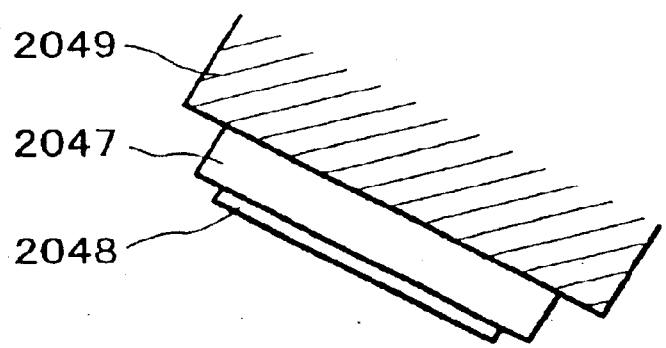

FIG. 53 is a sectional view of a yet further embodiment. This embodiment can be applied to a catoptric type optical system. A parallel plane plat 2047 made of SiC and having a diameter 200 mm and a thickness 30 mm and a diffractive optical element 2048 provided by a quartz wafer of a diameter 200 mm (eight inches) and a thickness 0.725 mm are bonded together in accordance with the direct bonding method like that of the embodiment of FIG. 26. It is then held by a holder 2049 of a catoptric system. Since no optical characteristic is required for this parallel plane plate 2047, a material of SiC having a relatively small thermal expansion coefficient, a good rigidity and a good thermal conductivity, is used in this example. However, other ceramics materials or metals may be used. Even for a reflection type diffractive optical element 2048 such as described above, an optical element with a fine grating pitch, having a good strength of about twice of higher rigidity, can be produced with good precision. It can be free from the influence of any external force, and can be incorporated into an optical system.

Figure 54:
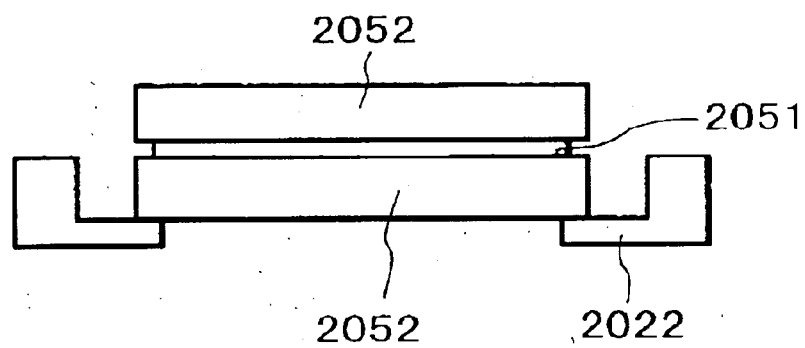
Figure 55:
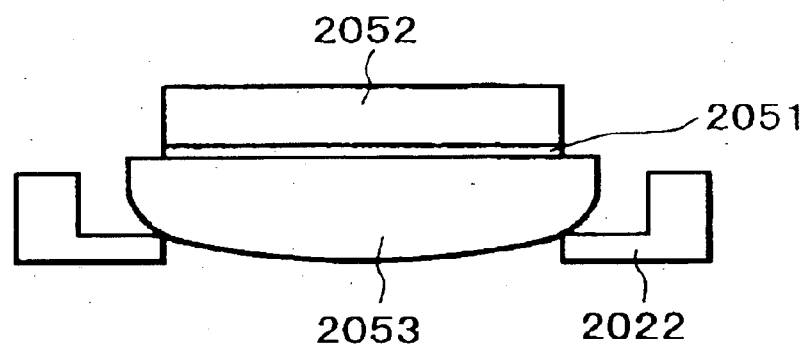

FIGS. 54–57 are sectional views of further embodiments, respectively. A diffractive optical element 2051 having a diffraction grating defined on a quartz wafer or a fluorite wafer with a diameter 200 mm (eight inches) and a thickness 0.725 mm, is used. FIG. 54 shows an example wherein two parallel plane plates 2052 of a diameter 200 mm and a thickness 20 mm are bonded to the opposite faces of the diffractive optical element 2051. This effectively prevents deposition of dust or foreign particles to the surface-step pattern, and easy cleaning is assured. FIG. 55 shows an example wherein a parallel plane plate 1052 having a diameter 200 mm and a thickness 10 mm and a plane-convex lens 2053 made of fluorite and having a diameter 225 mm are adhered to the opposite faces of the diffractive optical element 2051.

Figure 56:
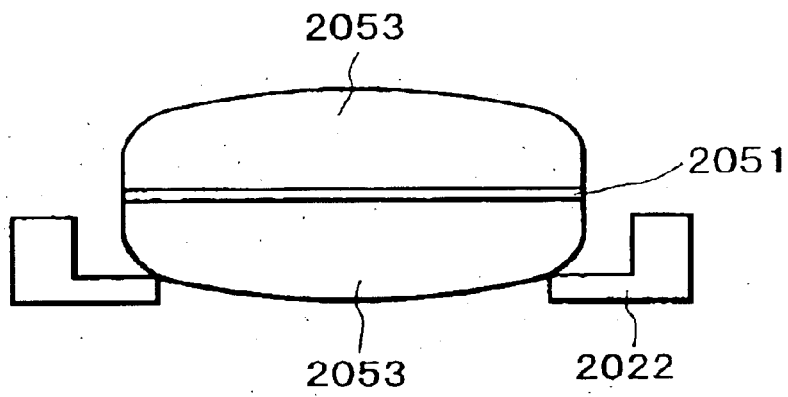
Figure 57:
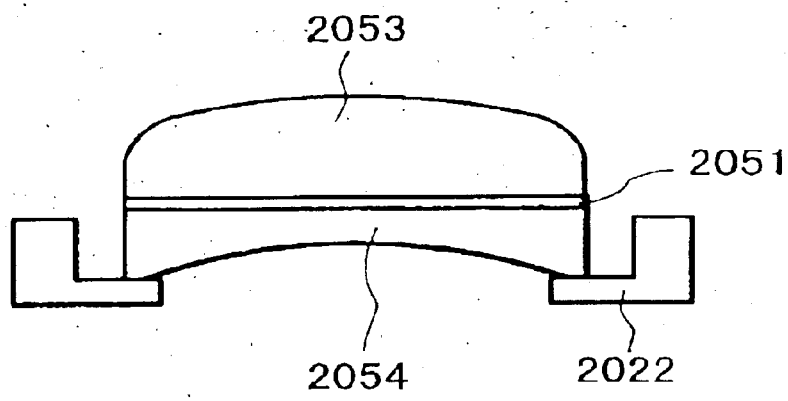

FIG. 56 shows an example wherein two plane-convex lenses 2053 made of fluorite and having a diameter 200 mm are bonded to the opposite faces of the diffractive optical element 2051. FIG. 57 shows an example wherein a plane-convex lens 2053 made of quartz or fluorite and a plane-concave lens 2054 made of quartz and having a diameter 200 mm are bonded to the opposite faces of the diffractive optical element 2051. In the examples of FIGS. 54–57, like the embodiment of FIG. 44, either the members may be bonded by direct bonding or they may not be bonded with each other.

By adhering members to the opposite faces of a diffractive optical element 2051 as described above, deposition of dust or foreign particles to the surface-step pattern can be prevented effectively, and easy cleaning is assured. Further, when the member or members to be bonded have optical characteristics, not only a sufficient rigidity is assured but also an increase in the optical path length of the glass materials of the whole optical system can be reduced or suppressed.

Figure 58:
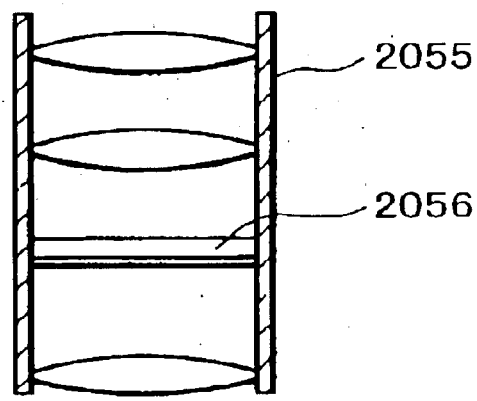
FIG. 58 is a schematic view of an optical arrangement in an exposure apparatus.

FIG. 58 is an enlarged view of a portion of an optical system in a semiconductor exposure apparatus. A diffractive optical element 2056 as being reinforced in the manner such as described above is incorporated into the optical system which is held by a barrel 2055. As compared with conventional diffractive optical elements, the diffractive optical element 2056 of this embodiment provides a rigidity of twice or more. Therefore, any deformation by weight, any deformation resulting from non-uniformness at the contact portion of the barrel 2055, due to the machining precision, or from distortion during the mounting due to the force applied by the fixation, or any deformation caused by a change in pressure or temperature can be reduced or removed. Additionally, since the plane deformation can be avoided and aberration can be made small, the optical performance is improved significantly. Thus, the performance as designed can be provided.

Further, as compared with an optical system using dioptric elements only, the number of lenses can be reduced. Therefore, absorption of light by glass materials can be reduced, and deformation of lenses due to absorbed heat or a change in refractive index thereof can be prevented or reduced. Further, since correction of chromatic aberration is easier, the bandwidth of laser light can be broadened, and the power of laser light can be used efficiently. Even if there occurs any change in environment of a semiconductor exposure apparatus, shift of the focal point position can be minimized, such that pattern transfer with good precision is assured.

The exposure apparatus shown in FIG. 58 may be used to perform the exposure process in the device manufacturing procedure shown in the flow charts of FIGS. 16 and 17.

A diffractive optical element such as described with reference to the preceding embodiments may be bonded together with another member or members into an integral structure, by which the rigidity can be enlarged. As result, any deformation by weight, any deformation resulting from non-uniformness at the contact portion of a barrel due to the machining precision, or from distortion during the mounting due to the force applied by the fixation, or any deformation caused by a change in pressure or temperature can be reduced or removed. It can be incorporated into an optical system without plane deformation, and can be used in an optical system for use with shorter wavelength light stably.

Further embodiments of the present invention will be described in detail, with reference to FIGS. 59–75.

Figure 59:
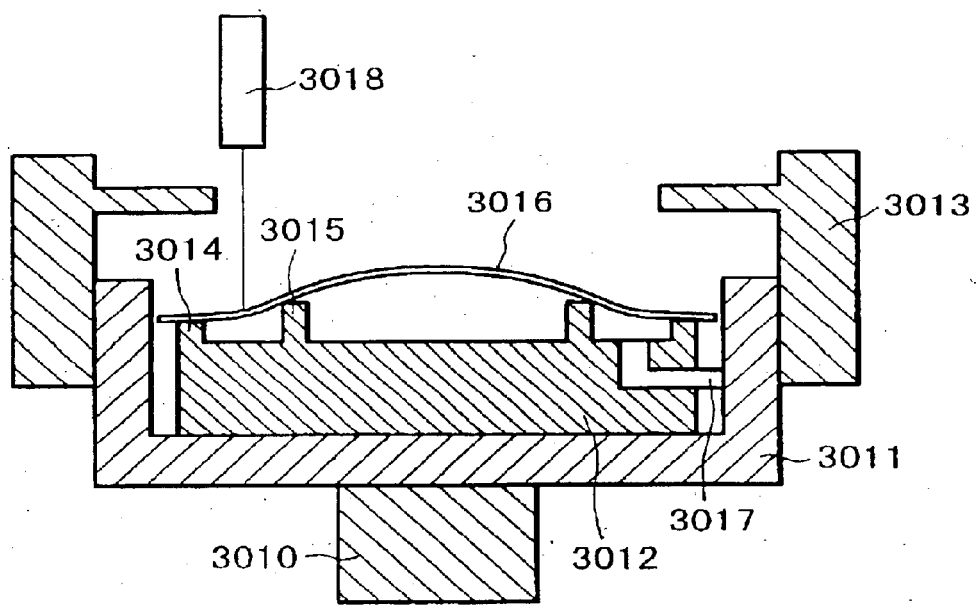
FIG. 59 is a schematic view of a bonding device according to an embodiment of the present invention.
Figure 60:
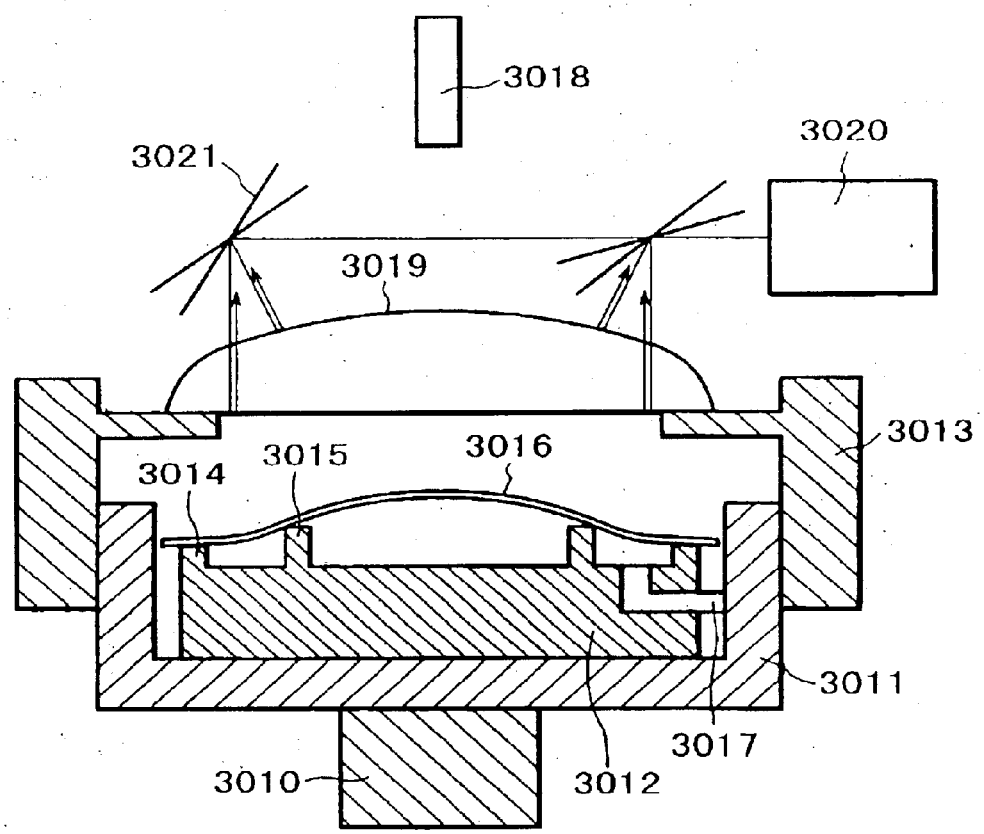
FIG. 60 is a schematic view for explaining a bonding operation.

FIGS. 59 and 60 are sectional views of a further embodiment, respectively. A fixing tool 3011 is made rotatable without fluctuation of its rotary shaft 3010 by means of an air bearing. A diffractive optical element chuck 3012 is mounted on the fixing holder 3011. Mounted on the outside face of the fixing holder 3011 is a lens holder 3013 of approximately cylindrical shape. Two, large and small, ring-like protrusions 3014 and 3015 having different diameters, are provided on the top surface of the chuck 3012, the protrusion being protruded upwardly. A discharging outlet port 3017 is formed between these protrusions 3014 and 3015, to attract a diffractive optical element 3016 having a diffraction grating defined on a quartz substrate. Both of the protrusions 3014 and 3015 have diameters smaller than the outermost peripheral pattern of the diffractive optical element 3016. The smaller protrusion 3015 having a smaller diameter has a height larger by 50 microns than that of the larger protrusion 3014.

Disposed above the chuck 3012 and the lens holder 3013 is an observing system for setting the center of the diffractive optical element 3016, which observing system is placed with eccentricity with respect to the rotational shaft 3010. In this embodiment, the observing system comprises a mark scope for reading an alignment mark or marks. Further, there are a laser measuring system 3020 and a mirror 3021, for measuring the distances to the top and bottom faces of a refraction lens 3019, for alignment of the lens 3019 to be set on the lens holder 3013.

Figure 61:
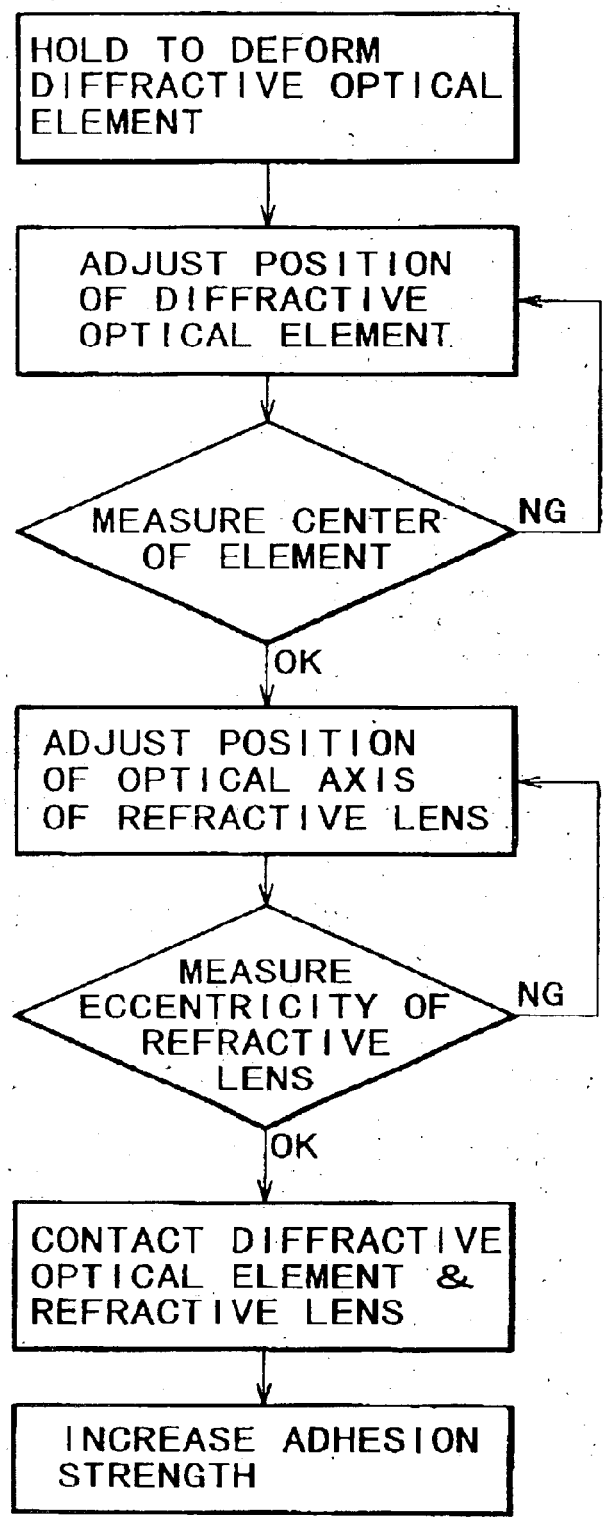
FIG. 61 is a flow chart of the bonding operation.
Figure 62:
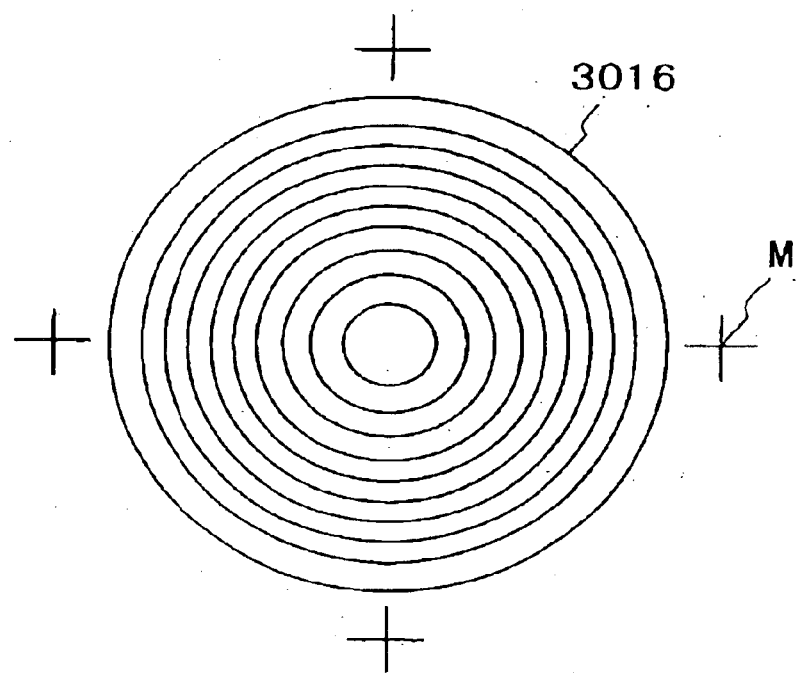
FIGS. 62 and 63 are schematic views, respectively, for explaining examples of alignment marks.
Figure 63:
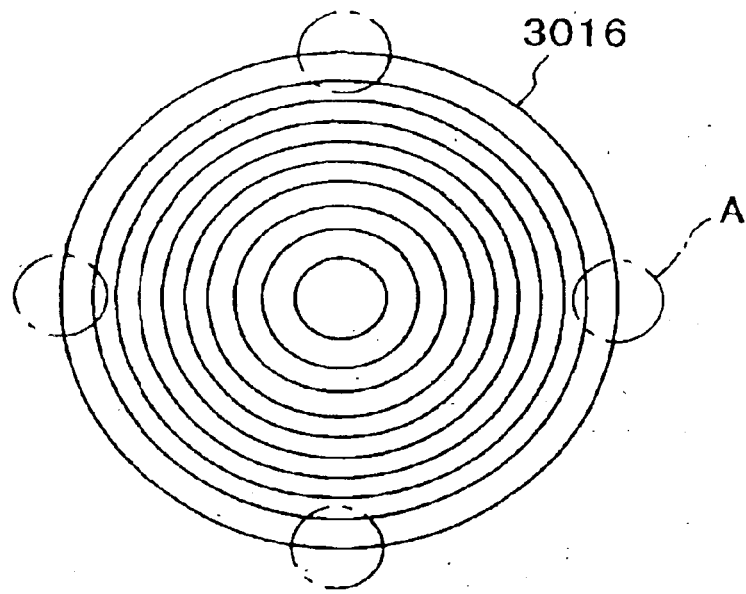

FIG. 61 is a flow chart for explaining the bonding procedure. The diffractive optical element 3016 is placed on the chuck 3012, and air is discharged outwardly through the outlet port 3017, whereby the optical element is held fixed by attraction. Here, since a negative pressure is produced in the space between the two protrusions 3014 and 3015, the portion of the diffractive optical element 3016 exposed to the negative pressure deforms toward the chuck 3012. As a result of this, moments are created at the outside peripheral portion of the diffractive optical element 3016, and the central portion of the diffractive optical element 3016 rises by a very small amount, while the contact point with the protrusion 3015 functions as a fulcrum.

Subsequently, for positional adjustment of the diffractive optical element 3016, the fixing holder 3011 is rotated by a predetermined angle to change the orientation of the diffractive optical element 3016. Then, the marks M (FIG. 62) of the diffractive optical element 3016 are measured by using the mark scope 3018, and, on the basis of it, the center of the diffractive optical element 3016 is brought into alignment with the center of the rotational shaft 3010 of the holder 3011.

First, the diffractive optical element 3016 is rotated sequentially each by 90 deg., and the amount of deviation between the marks M in orthogonal directions is calculated. Since the marks M are formed at equidistant positions from the center of the diffractive optical element 3016, the half of a positional difference between the marks M as measured while holding the mark scope 3016 position fixed corresponds to the amount of deviation. Then, by moving the chuck 3012 relative to the holder 3011, any eccentricity between the diffractive optical element 3016 and the holder 3011 is removed.

While, in this example, specific marks M are used to set the center of the diffractive optical element 3016, these marks M may be those specifically prepared for measurement of the center of the diffractive optical element 3016, or those marks having been used for the patterning for the formation of the diffractive optical element 3016 may be used as the marks M. As a further alternative, a pattern adjacent to the outside periphery of the diffractive optical element 3016, such as circular portions A (FIG. 63) may be measured in place of the marks M. The marks M may be formed outside the effective diameter of the diffractive optical element 3016, or they may be formed inside the effective diameter (at the central portion, for example).

As regards the observing system for setting the center of the diffractive optical element 3016, a plurality of observing systems may be provided with their positions calibrated beforehand. These observing systems may be used simultaneously or with partial overlap, to shorten the time required for the observation step. Alternatively, a single observing system whose position is calibrated beforehand with respect to the rotational shaft 3010 of the fixing holder 3011 may be disposed with respect to the center of the rotational shaft 3010 of the holder 3011, and the measurement may be made by using it.

After alignment of the diffractive optical element 3016, the refractive lens 3019 made of quartz is placed on the lens holder 3013, and an alignment operation and a bonding operation are performed. First, the refractive lens 3019 is placed in alignment with a desired position. The measurement of eccentricity of the refractive lens 3019 is made, initially, at two points which are eccentric with respect to the optical axis, by measuring the distances to the top and bottom faces of it with use of the laser measuring system 3020. As regards these two measurement points, relative alignment of them with respect to the rotary shaft 3010 of the holder 3011 has been performed before the operation.

Thus, any eccentricity and tilt of the optical axis center of the refractive lens 3019 with respect to the rotary shaft 3010 of the holder 3011 appears as the difference in distance to the surface of the refractive lens 3019. As the holder 3011 is rotated, an amplitude signal being synchronized with the rotation of the refractive lens 3019 is produced. Thus, by removing the eccentricity in regard to both of the top and bottom faces, the optical axis of the refractive lens 3019 can be brought into alignment with the rotary shaft 3010 of the holder 3011.

As regards the smoothness or roughness of the surface of the optical element to be bonded, it may be 0.8–0.9 nm in terms of square mean in the range of spatial frequency of about $1 \times 10^4$ no./mm, and it may be 0.2–0.3 nm in terms of square mean in the range of about 2–3 no./mm.

After removing the eccentricity of the diffractive optical element 3016 and the refractive lens 3019, the lens holder 3013 is moved down so that they are brought into contact with each other. Here, from the central position to be contacted first, there occurs a bonding phenomenon based on hydrogen bond, and an interference fringe due to clearance is observed at the interface of the bonding area. After the center is contacted, the negative pressure for attracting the diffractive optical element 3016 is turned gradually to the atmospheric pressure, whereby the diffractive optical element 3016 is released and the deformation is gradually removed. As the deformation becomes smaller, the hydrogen bond expands from the center to the peripheral portion. Finally, the whole surface of the diffractive optical element 3016 is bonded to the refractive lens 3019 (optical contact).

The bonding surface of the diffractive optical element 3016 should be maintained free of contamination by particles, for example. If contamination is there, it may cause defective bonding, called a "void", and cleaning is necessary. Also, as regards the attracted water content at the surface of quartz which is influential to the hydrogen bond, only the environment in storage should be cared about, regardless of the cleaning method. Usually, it is about $10^{13}$ molecule/cm$^2$, and no particular problem will be caused with respect to the level.

Since the diffractive optical element 3016 contacts to the holder 3011 only at its peripheral portion, even in a case where the bottom face (not a diffractive surface) is to be bonded, that is, when the surface having been treated by microprocessing is disposed at the chuck 3012 side, there does not occur contact between the chuck 3012 and the diffractive surface hating been treated by microprocessing. Thus, good bonding is accomplished.

When a lens as bonded such as described above is used, it may be used in the state of a hydrogen bond, or it may be treated by heating to improve the bonding force. One of SOI (silicon on insulator) techniques having been reported is a cementing SOI technique, and, generally, when the heating treatment is performed in the state of a hydrogen bond, the state of bonding changes to a covalent bond. In the period until a complete covalent bond is accomplished, the state may be considered as being a coexistence of a hydrogen bond and a covalent bond. The bonding strength increases with the increase of temperature in the heating process. Even with an optical glass containing an ordinary SiO$_2$ material as a major component, a similar procedure may be adopted to obtain good bonding.

Figure 64:
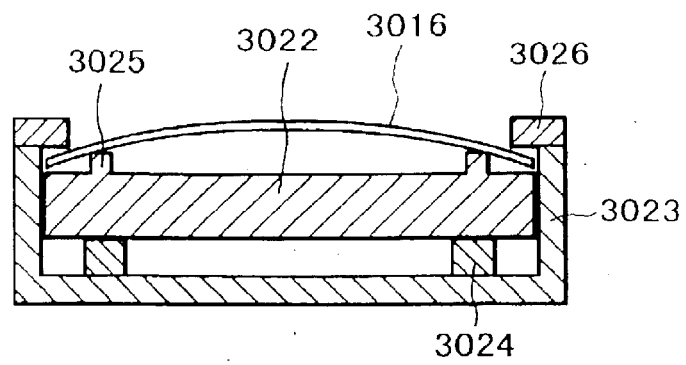
FIGS. 64, 65, 66, 67, 68, and 69 are schematic and sectional views, respectively, of examples of bonding devices, according to the present invention.

FIG. 64 is a sectional view of another embodiment. A diffractive optical element 3016 is held fixed by a fixing tool 3023 through a piezoelectric device 3024. A chuck 3022 is provided with a ring-like protrusion 3025, being protruded upwardly. At the top end of the holder 3023, there is a pressing member 3026 which is mounted detachably.

When the diffractive optical element 3016 is fixed on the chuck 3022, it contacts first to the ring-like protrusion 3025 which is placed at a higher level than the other components. After this, the pressing member 3026 is put on the diffractive optical element 3016, from above, and the pressing member is then held fixed on the holder 3023 by using fixing screws, not shown. Then, a voltage is applied to the piezoelectric device 3024, so as to press the chuck 3022 upwardly relative to the holder 3023. In this embodiment, to cause deformation of the diffractive optical element 3016, the chuck 3022 and the holder 3023 move relative to each other. As a result of this, moments are produced at the circumferential portion of the diffractive optical element 3016 being in contact with the ring-like protrusion 3025 and the pressing member 3026, by which good bonding with a refractive lens (not shown), for example, is accomplished.

The chuck 3022 and the holder 3023 may be made into an integral structure while omitting the piezoelectric device 3024, such that only tightening the fixing screws of the pressing member 3026 can produce deformation of the diffractive optical element 3016. However, use of the piezoelectric device 3024 may be preferably in that it assures stability of operation for applying uniform deformation regardless of the skill of the operator, for example.

Since the diffractive optical element 3016 contacts to the holder 3023 only at its peripheral portion, even in a case where the bottom face (not a diffractive surface) is to be bonded, that is, when the surface having been treated by microprocessing is disposed at the chuck 3022 side, there does not occur contact between the chuck 3022 and the diffractive surface having been treated by microprocessing. Thus, good bonding is accomplished.

Figure 65:
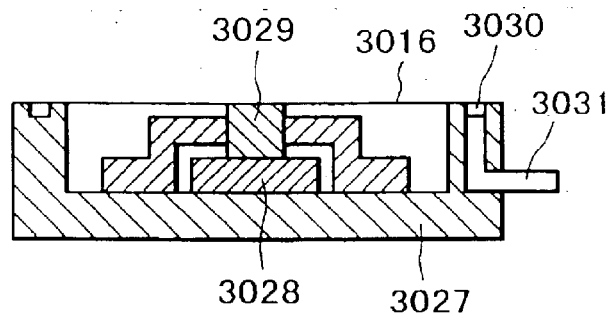

FIG. 65 is a sectional view of a yet further embodiment. A pin 3029 is mounted substantially at the center of a fixing tool 3027 through a piezoelectric device 3028. At the top of the side face of the holder 3027, there is an attracting groove 3030 formed in a ring-like shape. A discharging outlet port 3031 is connected to the attracting groove 3030.

A diffractive optical element 3016 as placed on the holder 3027 is attracted to the attracting groove 3030 being maintained in a negative pressure by evacuation through the outlet port 3031. After position adjustment is performed, a process for contacting the contact surface (not shown) with the plane of a refractive lens (not shown) is performed. In this process, a voltage is applied to the piezoelectric device 3028 so that the pin 3029 is protruded upwardly beyond the level of the attracting groove 3030. In response, due to the difference in level between the attracting groove 3030 and the pin 3029, the central portion of the diffractive optical element 3016 is deformed into a convex shape, whereby the central portion is brought into contact with the refractive lens (not shown).

Since in this embodiment the diffractive optical element 3016 contacts to the holder 3027 only at its peripheral portion, even in a case where the bottom face (not a diffractive surface) is to be bonded, that is, when the surface having been treated by microprocessing is disposed at the holder 3027 side, the area of contact of the diffractive surface having been treated by microprocessing is limited to the that of the pin 3029. Thus, good bonding is accomplished.

Figure 66:
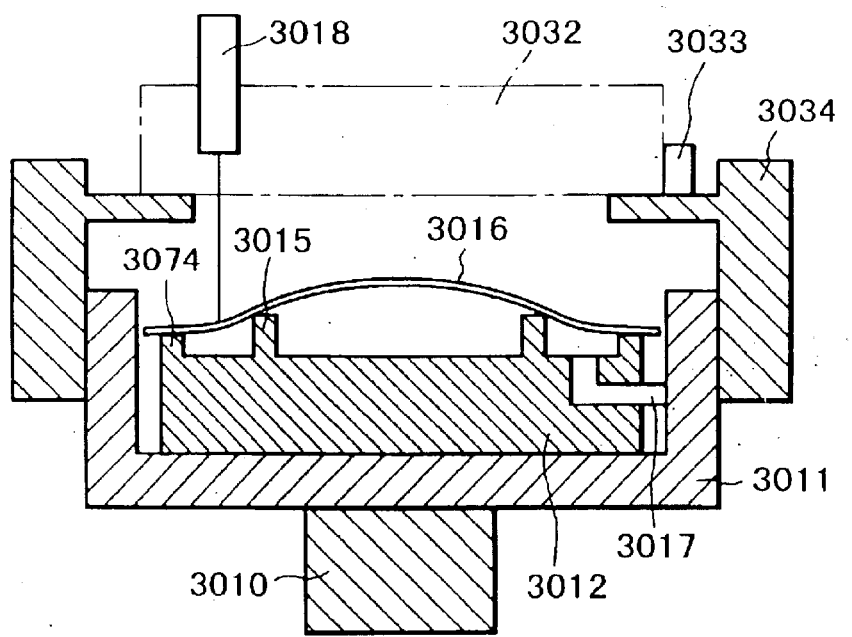

FIG. 66 is a sectional view of a further embodiment A diffractive optical element 3016 is bonded to a parallel plane plate 3032, not to a refractive lens. Mounted on the side face of the fixing holder 3011, like that of the embodiment described hereinbefore, is a parallel plate holder 3034 having a three-point abutment 3033 for positioning the parallel plane plate 3032. The diffractive optical element 3016 is made of quartz, and it has a position measuring mark.

The diffractive optical element 3016 is placed on the chuck 3012 and, by using a mark scope 3018, adjustment is performed so that the center of the diffractive optical element 3016 is brought into alignment with the center of the chuck 3012. Due to the negative pressure between protrusions 3074 and 3015, the diffractive optical element 3016 is attracted to the chuck 3012. Due to the protrusions 3074 and 3015, the central portion of the diffractive optical element 3016 deforms by a very small amount. The centering of the diffractive optical element 3016 may be made by using the pattern of the diffractive optical element itself. After the measurement, the mark scope 3018 moves outwardly of the bonding device to a place not interfering with the bonding operation.

As the parallel plane plate 3032 is mounted on the three-point abutment 3033 of the holder 3034, the center of the chuck 3012 and the center of the parallel plane plate 3032 are registered with each other. After aligning the diffractive optical element 3016 with the center of the parallel plane plate 3032, first the parallel plane plate 3032 contacts with the center of the diffractive optical element 3016. By turning the negative pressure between the protrusions 3074 and 3015 gradually toward the atmospheric pressure, deformation of the diffractive optical element 3016 is released and thus the diffractive optical element 3016 and the parallel plane plate 3032 are gradually contacted with each other, whereby they are bonded by direct bonding. Use of the parallel plane plate holder 3034 having the abutment 3033 enables good bonding with the parallel plane plate 3032 with respect to which the measurement of its central position is difficult to attain because of the shape thereof.

Figure 67:
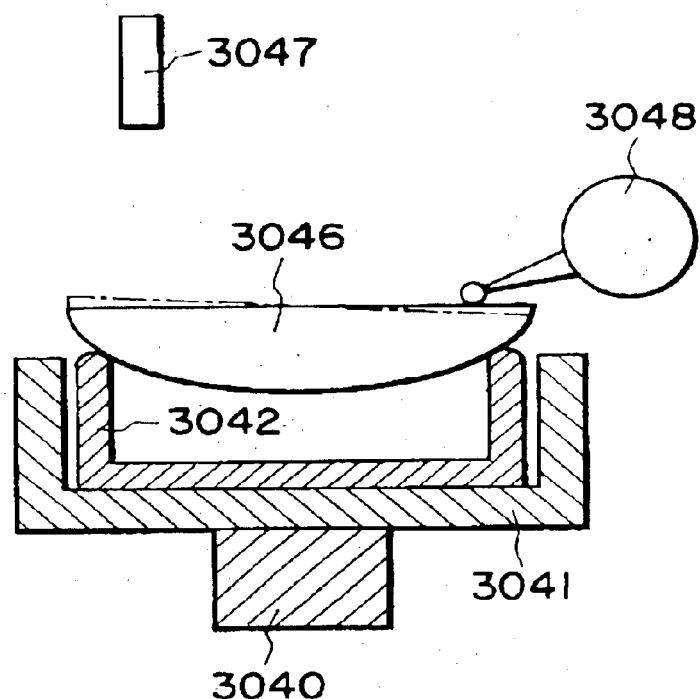
Figure 68:
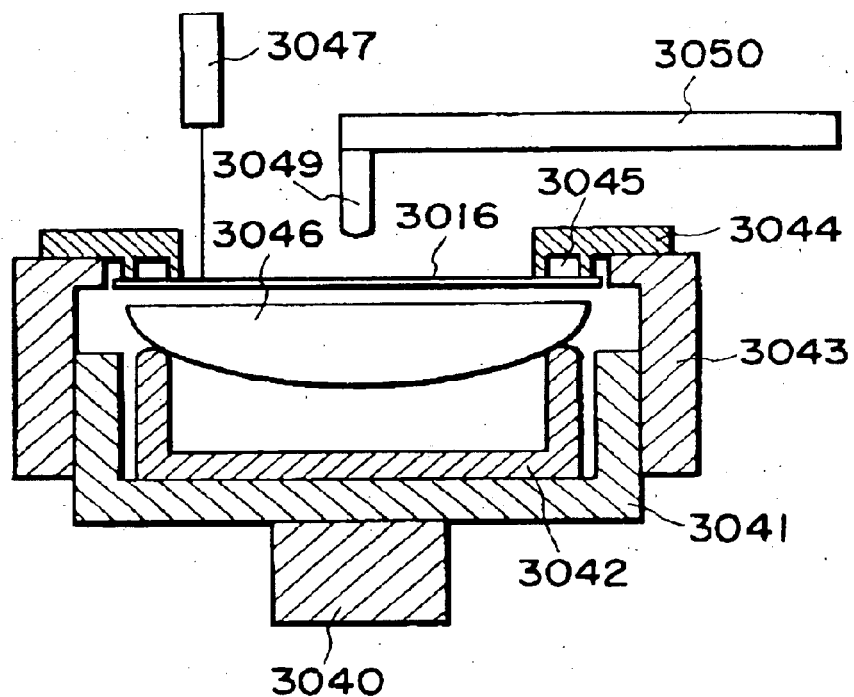

FIGS. 67 and 68 are sectional views of a still further embodiment. Mounted on a fixing tool 3041 which is rotatable about its rotary shaft 3040 is a holder 3042 having a cylindrical circumferential portion. Another fixing tool 3043 is detachably mounted on the side race of the holder 3041. A ring-like plane plate 3044 is movably mounted on the top of the fixing holder 3043, and a ring-like attracting groove 3045 is formed in the ring-like plate 3044, with the groove facing down. The holder 3042 supports a plane-convex lens 3046, for example. A diffractive optical element 3016 is held through attraction by the attracting groove 3045 of the ring-like plate 3044. At the peripheral position above the diffractive optical element 3016 and the plane-convex lens 3046, there are a mark scope 3047 and a micrometer. Also, a pressing pin 3049 is held by a bar 3050, substantially at the central position.

In FIG. 67, the plane-convex lens 3046 is placed on the holder 3042 of the fixing tool 3041 with its convexed surface facing down. The probe of the micrometer 3048 contacts with the plane surface at the top of the lens 3046. In a case where the optical axis of the lens 3046 is deviated with respect to the rotational shaft 3040 of the fixing holder 3041, the value as represented by the micrometer 3048 varies with rotation of the fixing holder 3041 as a whole about its rotational shaft 3040. Thus, the position of the plane-convex lens 3046 is corrected so that the output value of the micrometer 3048 is stabilized even with rotation of the whole fixing holder 3041 and, by doing so, the optical axis of the lens 3046 can be aligned with the rotational shaft 3040.

Subsequently, as shown in FIG. 68, the holder 3043 having the diffractive optical clement 3016 attracted to the attracting groove 3046 is mounted on the tool 3041, so that the diffractive optical element 3016 is disposed opposed to the flat face side of the lens 3046. The diffractive optical element 3016 is controlled with a distance of about several tens of microns to the flat face of the plane-convex lens 3046. In this state, the tool 3041 as a whole is rotated by a predetermined angle to change the orientation of the diffractive optical element 3016, such that marks of the diffractive optical element 3016 can be measured by the mark scope 3047. Then, like the embodiment described hereinbefore, the diffractive optical element 3016 is sequentially rotated each by 90 deg., and the amount of deviation of the marks in orthogonal directions is calculated. If the marks are formed at equidistant positions from the center of the diffractive optical element 3016, then a half of the positional deviation of the marks as observed through the observation system being fixed corresponds to the amount of eccentricity. By moving the ring-like plate 3044 relative to the tool 3041, any eccentricity of the diffractive optical element 3016 with respect to the rotational shaft 3040 of the holder 3041 can be removed.

Thereafter, the central portion of the diffractive optical element 3016 is pushed upwardly by the pressing pin 3049, such that the central portion is first brought into contact with the plane-convex lens 3046. Subsequently, the diffractive optical element 3016 being attracted to the attracting groove 3045 of the ring-like plate 3044 is gradually released so that the whole bonding area is brought into contact with the lens. By this, good bonding is accomplished.

Figure 69:
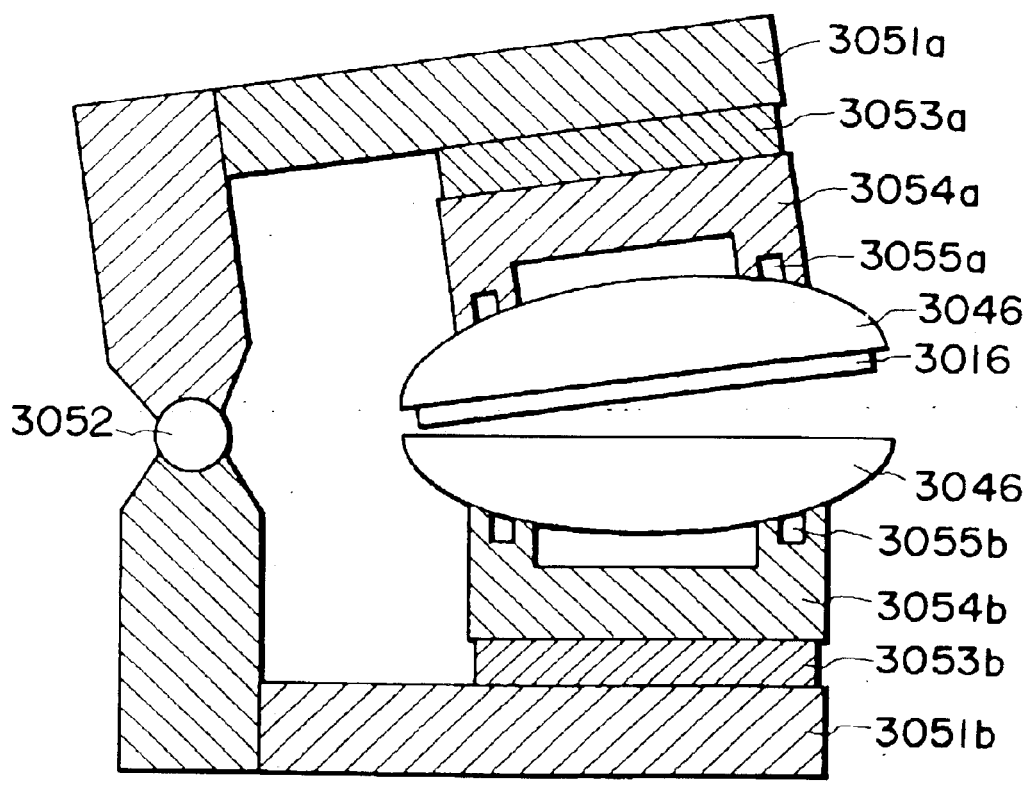

FIG. 69 is a sectional view of a still further embodiment. A diffractive optical element and a separate optical element are made into an integral structure in accordance with any one of the processes or devices having been described with reference to the preceding five embodiments. After this, the optical element is combined with a yet further optical element into an integral structure. Upper and lower frames 3051a and 3051b are movably coupled with each other by using a hinge 3052. Fixing holders 3054a and 3054b are connected to the upper and lower frames 3051a and 3051b, respectively, through elastic members 3053a and 3053b, respectively. These fixing holders 3054a and 3054b are formed with attracting grooves 3055a and 3055b, respectively.

Figure 70:
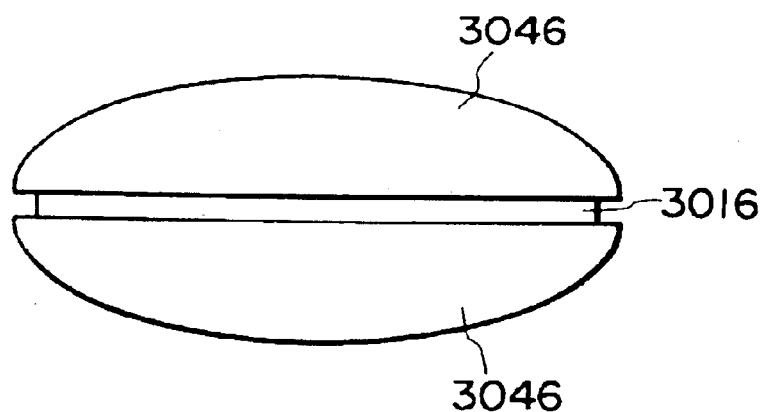
FIGS. 70, 71, 72 and 73 are side views, respectively, of examples of compound optic elements.
Figure 71:
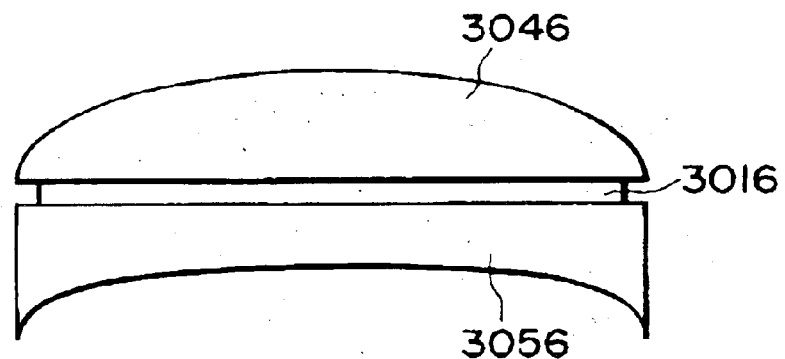
Figure 72:
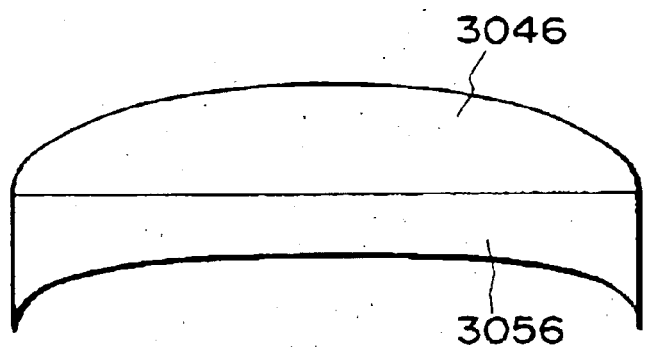

With the arrangement described above, after a diffractive optical element 3016 and a plane-convex lens 3046 are combined into an integral structure, a separate plane-convex lens 3046 may be combined to it, as shown in FIG. 70. Alternatively, as shown in FIG. 71, after a diffractive optical element 3016 and a plane-convex lens 3046 are combined into an integral structure, a plane-concave lens 3056 may be combined to it. The order of bonding of these elements into an integral structure may be reversed.

A diffractive optical element 3016 and a plane-convex lens 3046 may be bonded together in accordance with any one of the preceding five embodiments, and then they are placed on and held by the holder 3054a or 3054b while a negative pressure is produced in the attracting groove 3055a or 3055b. Alignment of the elements with respect to the holder 3054a or 3054b may be performed in accordance with any one of the methods of the preceding five embodiments. For example, if the diffractive optical element 3016 is made into an integral structure, the marks for setting the center of the diffractive optical element 3016 or the outside peripheral pattern thereof may be used. Alternatively, the alignment process may be made on the basis of the shape of the lens 3046. For example, the side face may be measured and the alignment process may be performed on the basis of the side face or the outside diameter thereof. Both the top and bottom faces thereof may be used.

When the lenses 3046 are held by the holders 3054a and 3054b, the inside flat surfaces of the holders 3054a and 3054b having attracting means with the attracting grooves 3055a and 3055b as well as the two surfaces of the lenses 3046 are used to perform position adjustment. More specifically, a lasers interferometer is used to measure the respective distances between the inside flat surfaces of the attracting means and to the surfaces of the lenses 3046. A position where the distances from the inside flat surfaces to the surfaces of the lenses 3046 on the sides facing the holders 3054a and 3054b, respectively, are equal to each other, is determined as a measurement point. The holding positions for the lenses 3046 are adjusted so that, at the thus determined measurement point, the distances between the top and bottom surfaces of the lenses 3046, that is, the lens thicknesses, become equal to each other. By doing so, the centers of the ring-like supporting members of the holders 3054a and 3054b, having the attracting grooves 3055a and 3055b, are registered with each other. Thus, the centers of the optical elements when combined together, can be registered with each other.

Subsequently, the frames 3051a and 3051b are moved pivotally around the hinge 3052 to bring the optical elements into contact with each other. Here, if, in the state where the virtual planes of the holder 3054a and 3054b, supporting the optical elements, are placed in parallel to each other, the distance between these virtual planes is made smaller than the thickness of the lens 3046, then the contact of the optical elements is initiated from the portions close to the hinge 3052. It is to be noted here that, even if non-uniform contact is started, deformation of the elastic members 3053a and 3053b can absorb any discrepancy in geometrical arrangement.

Figure 73:
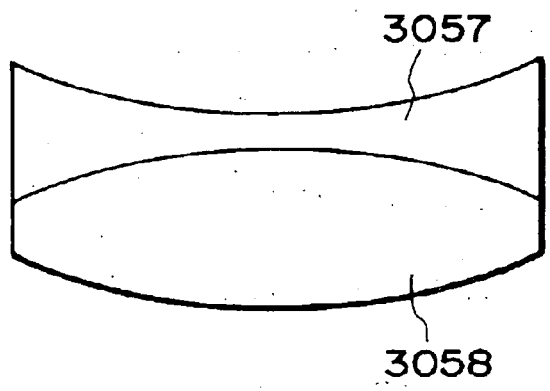

In accordance with this embodiment, a combination of a plane-convex lens 3046 and a plane-concave lens 3056 (FIG. 72), a combination of plane-convex lenses or a combination of plane-concave lenses, not shown, can be accomplished. Further, as shown in FIG. 73, spherical lenses 3057 and 3058 can be bonded together at their surfaces with the same curvature. While this embodiment has been described with reference to an example wherein the third member to be bonded is whole-surface bonded from a non-parallel state to a parallel state, a similar procedure may be adopted when a diffractive optical element is combined with another member into an integral structure. With this method, substrates of large thicknesses can be bonded together.

Figure 74:
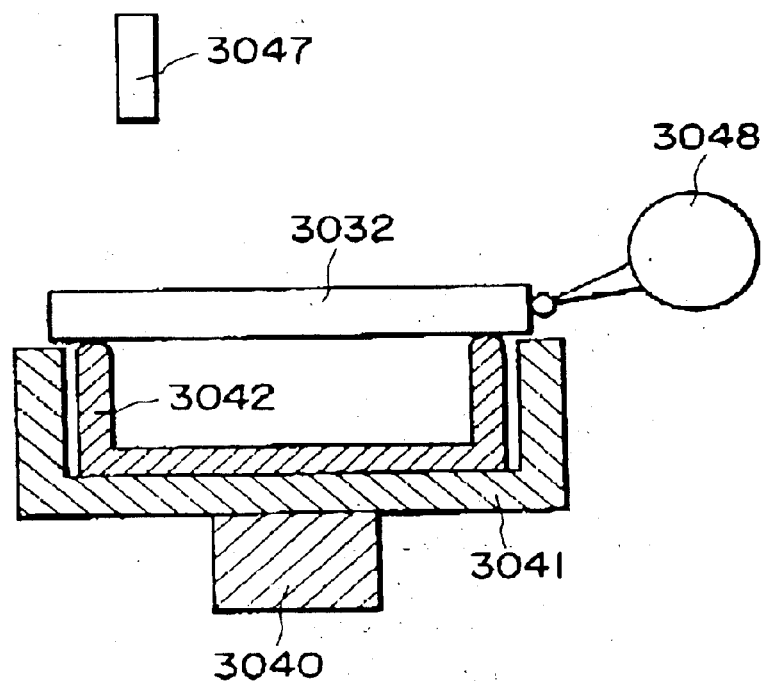
FIGS. 74 and 75 are schematic and sectional views, respectively, of bonding devices according to further embodiments of the present invention, respectively.
Figure 75:
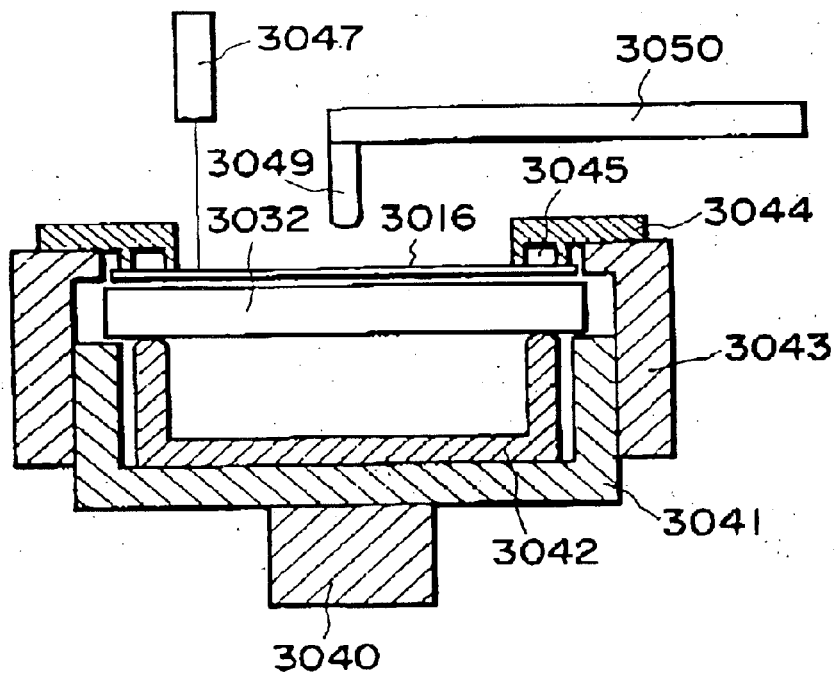

FIGS. 74 and 75 are sectional views of a yet further embodiment. The structure is similar to that of the embodiment of FIGS. 67 and 68. A diffractive optical element 3016 is bonded with a parallel plane plate 3032, not with a plane-convex lens. In FIG. 74, a parallel plane plate 3032 is placed on a holder 3042 of a fixing tool 3041, and a probe of a micrometer 3048 contacts the side face of the parallel plate 3032. If the center of the parallel plate 3032 is deviated with respect to the rotational shaft 3040 of the fixing holder 3041, the value as represented by the micrometer 3048 varies with rotation of the fixing holder 3041 as a whole. Thus, the position of the parallel plate 3032 is corrected so that the output value of the micrometer 3048 is stabilized even with rotation of the whole fixing holder 3041 and, by doing so, the center of the plate 3032 can be aligned with the rotational shaft 3040.

Subsequently, as shown in FIG. 75, the diffractive optical element 3016 and the parallel plane plate 3032 are disposed opposed to each other, and the diffractive optical element 3016 is held by the attracting groove 3045. The diffractive optical element 3016 is controlled with a distance of about several tens of microns to the parallel plane plate 3032. In this state, the tool 3041 as a whole is rotated by a predetermined angle to change the orientation of the diffractive optical element 3016, such that marks of the diffractive optical element 3016 can be measured by the mark scope 3047. Then, like the embodiment described hereinbefore, the diffractive optical element 3016 is sequentially rotated each by 90 deg., and the amount of deviation of the marks in orthogonal directions is calculated. When two marks in orthogonal directions and at equidistant positions from the center of the diffractive optical element 3016 are measured by using the mark scope 3047 having its position held fixed, then a half of the positional deviation of the marks corresponds to the amount of eccentricity. By moving the ring-like plate 3044 relative to the tool 3041, any eccentricity of the diffractive optical element 3016 with respect to the rotational shift 3040 of the holder 3041 can be removed.

Thereafter, the central portion of the diffractive optical element 3016 is pushed by a pressing pin 3049, such that the central portion is brought into contact with the parallel plane plate 3032. Subsequently, the diffractive optical element 3016 is gradually released from the attracting groove 3045, whereby the contact extends throughout the whole bonding area. Thus, good bonding is accomplished.

As the material to be bonded, use may be made of a fluoride such as fluorite or quartz (e.g., lithium fluoride, barium fluoride, magnesium fluoride, or strontium fluoride). On that occasion, if quartz is bonded by deformation, it can be done without any inconvenience. In a case where fluorite having a Young's modulus close to that of the quartz is deformed, a similar procedure as having been described with reference to the preceding seven embodiments may be used to perform good bonding based on a hydrogen bond.

Fluoride materials as fluorite (e.g., lithium fluoride, barium fluoride, magnesium fluoride, or strontium fluoride) may be bonded together. On that occasion, even fluorite may be deformed in accordance with the procedure having been described hereinbefore, and good bonding based on a hydrogen bond may be accomplished similarly.

A super-pure water of 0.05 cc by be dropped onto the surface to be bonded, and it may then be contacted to a refractive lens. Since in this state the elements to be bonded together may relatively shift easily, they may be held in a dry ambience gas while being fixed by a holder. While it may be different depending on the ambience, after an elapse of a few hours or several tens of hours, a hydrogen bond with excessive water being removed may be accomplished, such that optical components may be bonded together tightly. According to experiments made by the inventors, it has been confirmed that, if heating treatment is performed in addition to holding the elements in a dry ambience gas, excessive water can be removed in a shorter time period.

While the invention has been described with reference to the structures disclosed herein, it is not confined to the details set forth and this application is intended to cover such modifications or changes as may come within the purposes of the improvements or the scope of the following claims.

What is claimed is:

1. An optical system for forming an image of a pattern formed on a reticle, upon on an object to be exposed, said optical system comprising:

an optical element being able to be deformed by the weight thereof; and at least one aspherical surface effective to reduce a change in optical performance of said optical system due to deformation of said optical element as said optical element is provided in said optical system, wherein said optical element and said at least one aspherical surface are disposed between the reticle and the object to be exposed.

2. An optical system according to claim 1, wherein said optical element is a diffractive optical element.

3. An optical system according to claim 1, wherein said optical element has a step-like shape.

4. A projection exposure apparatus, comprising:

an illumination optical system for illuminating a pattern formed on a reticle; and a projection optical system for projecting light from the pattern, said projection optical system including an optical system as recited in claim 1.

5. A device manufacturing method comprising:

a process for transferring, through projection exposure, a pattern of a reticle onto an object to be exposed by use of a projection exposure apparatus as recited in claim 4.

6. An optical system according to claim 1, wherein said optical system further comprises a first optical member disposed adjacent to said optical element and wherein said at least one aspherical surface is formed on said first optical member.

7. An optical system according to claim 6, wherein one of said at least one aspherical surface is formed on one surface of said first optical member that faces the reticle.

8. An optical system according to claim 6, wherein one of said at least one aspherical surface is formed on one surface of said first optical member that is remote from the reticle.

9. An optical system according to claim 1, wherein said optical system further comprises a first optical member disposed adjacent to said optical element, and a second optical member disposed adjacent to said first optical member, and wherein said at least one aspherical surface is formed on at least one of said first optical member and said second optical member.

10. An optical system according to claim 9, wherein one of said at least one aspherical surface is formed on one surface of said second optical member that is remote from the reticle.

11. An optical system according to claim 1, wherein said optical element has one of a positive optical power and a negative optical power.

* * * * *

UNITED STATES PATENT AND TRADEMARK OFFICE
CERTIFICATE OF CORRECTION

PATENT NO.       : 6,829,091 B2
APPLICATION NO.  : 09/362698
DATED            : December 7, 2004
INVENTOR(S)      : Takashi Kato et al.

It is certified that error appears in the above-identified patent and that said Letters Patent is hereby corrected as shown below:

ON THE COVER PAGE:
  In section "(*) Notice:" after "0 days.", insert the following paragraph:

-- This patent issued on a continued prosecution application filed under 37 C.F.R. 1.53(d), and is subject to the twenty year patent term provisions of 35 U.S.C. 154(a)(2). --

In section "(56) References Cited," under "FOREIGN PATENT DOCUMENTS," "JP   6-242373   2/1994" should read -- JP   6-242373   9/1994 --.

COLUMN 2:
  Line 38, "fiat" should read -- flat --.

COLUMN 3:
  Line 33, "system" should read -- system. --.

COLUMN 5:
  Line 54, "element" should read -- element. --.

COLUMN 7:
  Line 8, " $x = \{ch^2 / 1 + \sqrt{1} - (1 + k)c^2h^2]\} + Ah^4 + Bh^6 + $ "

should read -- $x = \{ch^2 /[1 + \sqrt{1 - (1 + k)c^2h^2}]\} + Ah^4 + Bh^6 + $ --.

Line 59, " $f(h) = a1 \cdot h^2 + a2h^4 + a3 \cdot h^6 + a4 \cdot h^8 + ... g(h)2\pi/\lambda \cdot f(h)$ "

should read --
$$f(h) = a1 \cdot h^2 + a2 \cdot h^4 + a3 \cdot h^6 + a4 \cdot h^8 + ...$$
$$g(h) = 2\pi / \lambda \cdot f(h)$$
--.

COLUMN 8:
  Line 45, "Distributicn" should read -- Distribution --.

COLUMN 9:
  Line 12, "Distributicn" should read -- Distribution --.

COLUMN 10:
  Line 45, "problems)," should read -- problem), --.

COLUMN 11:
  Line 24, "can not" should read -- cannot --.

UNITED STATES PATENT AND TRADEMARK OFFICE
CERTIFICATE OF CORRECTION

| | |
|---|---|
| PATENT NO. | : 6,829,091 B2 |
| APPLICATION NO. | : 09/362698 |
| DATED | : December 7, 2004 |
| INVENTOR(S) | : Takashi Kato et al. |

It is certified that error appears in the above-identified patent and that said Letters Patent is hereby corrected as shown below:

COLUMN 13:
        Line 2, "10-30 ml." should read -- 10-30 mm. --.
        Line 3, "water," should read -- wafer, --.
        Line 10, "agent.)" should read -- agent). --.

COLUMN 15:
        Line 28, "boding" should read -- bonding --.
        Line 30, "sued" should read -- used --.

COLUMN 16:
        Line 38, "water" should read -- wafer --.

COLUMN 17:
        Line 64, "my" should read -- may be --.

COLUMN 18:
        Line 33, "Walls" should read -- Waals --.

COLUMN 20:
        Line 32, "embodiment" should read -- embodiment. --.

COLUMN 22:
        Line 6, "plat" should read -- plate --.
        Line 21, "of" should read -- or --.

COLUMN 25:
        Line 46, "hating" should read -- having --.

COLUMN 26:
        Line 60, the first occurrence of "the" should be deleted.

COLUMN 27:
        Line 38, "race" should read -- face --.

UNITED STATES PATENT AND TRADEMARK OFFICE
CERTIFICATE OF CORRECTION

PATENT NO. : 6,829,091 B2
APPLICATION NO. : 09/362698
DATED : December 7, 2004
INVENTOR(S) : Takashi Kato et al.

It is certified that error appears in the above-identified patent and that said Letters Patent is hereby corrected as shown below:

COLUMN 29:
　　　Line 6, "lasers" should read -- laser --.

COLUMN 30:
　　　Line 59, the second occurrence of "on" should be deleted.

Signed and Sealed this

Nineteenth Day of February, 2008

JON W. DUDAS
*Director of the United States Patent and Trademark Office*